(12) United States Patent
Yamamoto et al.

(10) Patent No.: US 9,705,092 B2
(45) Date of Patent: Jul. 11, 2017

(54) PHOSPHORESCENT ORGANIC LIGHT EMITTING DEVICES COMBINED WITH HOLE TRANSPORT MATERIAL HAVING HIGH OPERATING STABILITY

(75) Inventors: Hitoshi Yamamoto, Princeton, NJ (US); Michael Stewart Weaver, Princeton, NJ (US); Norimasa Yokoyama, Tsukuba (JP); Makoto Nagaoka, Tsukuba (JP); Naoaki Kabasawa, Tsukuba (JP)

(73) Assignees: Universal Display Corporation, Ewing, NJ (US); Hodogaya Chemical Co., Ltd., Tokyo (JP)

( * ) Notice: Subject to any disclaimer, the term of this patent is extended or adjusted under 35 U.S.C. 154(b) by 600 days.

(21) Appl. No.: 14/237,142

(22) PCT Filed: Aug. 5, 2011

(86) PCT No.: PCT/US2011/046736
§ 371 (c)(1),
(2), (4) Date: Mar. 31, 2014

(87) PCT Pub. No.: WO2013/022419
PCT Pub. Date: Feb. 14, 2013

(65) Prior Publication Data
US 2014/0339518 A1    Nov. 20, 2014

(51) Int. Cl.
*H01L 51/50* (2006.01)
*H01L 51/00* (2006.01)
(Continued)

(52) U.S. Cl.
CPC ......... *H01L 51/0072* (2013.01); *C09K 11/06* (2013.01); *H01L 51/0054* (2013.01);
(Continued)

(58) Field of Classification Search
None
See application file for complete search history.

(56) References Cited

U.S. PATENT DOCUMENTS

2002/0034656 A1*  3/2002  Thompson ........... C07D 209/86
                                                        428/690
2006/0073357 A1    4/2006  Brunner et al.
(Continued)

FOREIGN PATENT DOCUMENTS

CN   102850177    1/2013
EP     1589789   10/2005
(Continued)

OTHER PUBLICATIONS

Search Report issued on Oct. 28, 2015 in corresponding Taiwanese Patent Application No. 101128015.
(Continued)

*Primary Examiner* — Gregory Clark
(74) *Attorney, Agent, or Firm* — Duane Morris LLP

(57) ABSTRACT

An improved OLED includes an emitter layer disposed between a cathode and an anode where the emitter layer includes a host material and a phosphorescent emitter material. A first hole transport layer is disposed between the emitter layer and the anode and a second hole transport layer is disposed between the first hole transport layer and the anode. The first hole transport layer includes a first hole transport material that is a carbazole type compound and the second hole transport layer includes a second hole transport material that is different from the first hole transport material. The phosphorescent emitter material includes a phosphorescent organometallic compound that is a heteroleptic compound represented by the formula L₂MX, LL'MX, LL'L"M, or LMXX', wherein L, L', L", X, and X' are inequivalent, bidentate ligands and M is a metal that forms octahedral complexes, wherein L, L', and L" are monoan-
(Continued)

ionic inequivalent bidentate ligands coordinated to M through an sp² hybridized carbon and a heteroatom.

19 Claims, 2 Drawing Sheets

(51) Int. Cl.
*C09K 11/06* (2006.01)
*H05B 33/14* (2006.01)

(52) U.S. Cl.
CPC ...... *H01L 51/0059* (2013.01); *H01L 51/0074* (2013.01); *H01L 51/5016* (2013.01); *H01L 51/5064* (2013.01); *H05B 33/14* (2013.01); *C09K 2211/185* (2013.01)

(56) References Cited

U.S. PATENT DOCUMENTS

2007/0231596 A1 10/2007 Spindler et al.
2010/0237334 A1* 9/2010 Ma .................. C07D 307/91
257/40
2012/0205642 A1* 8/2012 Yokoyama ........... C07D 209/86
257/40

FOREIGN PATENT DOCUMENTS

| JP | 8003547 | 1/1996 |
|---|---|---|
| KR | 20090028943 | 3/2009 |
| WO | 2009/021126 | 2/2009 |
| WO | 2010/027583 | 3/2010 |
| WO | 2010/028151 | 3/2010 |
| WO | 2011/048821 | 4/2011 |
| WO | 2011/048822 | 4/2011 |

OTHER PUBLICATIONS

Yamamoto, H. et al., "High Efficiency and Long-Lived Green Phosphorescent OLEDs," the 16th International Display Workshops, Miyazaki, Japan, Papers OLED1-3, 435 (2009).

* cited by examiner

PHOSPHORESCENT ORGANIC LIGHT EMITTING DEVICES COMBINED WITH HOLE TRANSPORT MATERIAL HAVING HIGH OPERATING STABILITY

FIELD OF THE INVENTION

The present invention relates to an organic electroluminescent (EL) device such as an organic light emitting device (hereinafter abbreviated as an OLED) and materials capable of being used in such an OLED. In particular, it relates to an OLED which comprises a light emitting layer which emits a green light, and materials for such an OLED.

BACKGROUND OF THE INVENTION

OLEDs which comprise an organic thin film layer which includes a light emitting layer located between an anode and a cathode are known in the art. In such devices, emission of light may be obtained from exciton energy, produced by recombination of a hole injected into a light emitting layer with an electron.

OLEDs make use of thin organic films that emit light when voltage is applied across the device. Generally, OLEDs are comprised of several organic layers in which at least one of the layers can be made to electroluminesce by applying a voltage across the device. When a voltage is applied across a device, the cathode effectively reduces the adjacent organic layers (i.e., injects electrons), and the anode effectively oxidizes the adjacent organic layers (i.e., injects holes). Holes and electrons migrate across the device toward their respective oppositely charged electrodes. When a hole and electron meet on the same molecule, recombination is said to occur, and an exciton is formed. Recombination of the hole and electron in luminescent compounds is accompanied by radiative emission, thereby producing electroluminescence.

Depending on the spin states of the hole and electron, the exciton resulting from hole and electron recombination can have either a triplet or singlet spin state. Luminescence from a singlet exciton results in fluorescence, whereas luminescence from a triplet exciton results in phosphorescence. Statistically, for organic materials typically used in OLEDs, one quarter of the excitons are singlets, and the remaining three-quarters are triplets. Electro-phosphorescent OLEDs have been shown to have superior overall device efficiencies as compared with electro-fluorescent OLEDs.

Due to strong spin-orbit coupling that leads to singlet-triplet state mixing, heavy metal complexes often display efficient phosphorescent emission from such triplets at room temperature. Accordingly, OLEDs comprising such complexes have been shown to have internal quantum efficiencies of more than 75% (Adachi, et al., Appl. Phys. Lett., 2000, 77, 904). Certain organometallic iridium complexes have been reported as having intense phosphorescence (Lamansky, et al., Inorganic Chemistry, 2001, 40, 1704), and efficient OLEDs emitting in the green to red spectrum have been prepared with these complexes (Lamansky, et al., J. Am. Chem. Soc., 2001, 123, 4304). OLEDs, as described above, generally provide excellent luminous efficiency, image quality, power consumption and the ability to be incorporated into thin design products such as flat screens, and therefore hold many advantages over prior technology, such as cathode ray devices.

Development of light emitting phosphorescent materials in which light emission is obtained from a triplet exciton resulting in enhanced internal quantum efficiency have lead to OLEDs having greater current efficiency. Such phosphorescent materials may be used as a dopant in a host material which comprises such a light emitting layer.

In a light emitting layer formed by doping with a light emitting material such as a phosphorescent material, excitons can efficiently be produced from a charge injected into a host material. Exciton energy of an exciton produced may be transferred to a dopant, and light emission may be obtained from the dopant at high efficiency. Exitons may be formed either on the host materials or directly on the dopant.

In order to achieve intermolecular energy transfer from a host material to a phosphorescent dopant with high device efficiencies, the excited triplet energy Eg(T) of the host material must be greater than the Eg(T) of the phosphorescent dopant. In order to carry out intermolecular energy transfer from a host material to a phosphorescent dopant, the Eg(T) of the host material has to be larger than the Eg(T) of the phosphorescent dopant.

PCT Publication No. WO2011/048821 published on Apr. 28, 2011 discloses certain prior art OLED devices, Example 6 and Example 7, in which Ir(ppy)3 is provided as the electroluminescent dopant and a carbazole type compound is provided as an electron blocking layer between the electro luminescent layer and a hole injection layer. WO2011/048821 also discloses additional prior art OLED devices, Comparative Example 1 and Comparative Example 2, in which the electron blocking layer is omitted for comparison purposes. Table 1 provides the device performance data for the prior art devices Example 6, Example 7, Comparative Example 1 and Comparative Example 2.

TABLE 1

| | | | | | At 10 mA/cm$^2$ | | At 1000 nits | |
|---|---|---|---|---|---|---|---|---|
| | 1931 CIE | | Voltage | Luminance | Power Efficiency | Voltage | LE | EQE |
| Device # | x | y | (V) | (cd/m$^2$) | (lm/W) | (V) | (cd/A) | (%) |
| Example 6 from WO2011/048821 | 0.309 | 0.615 | 5.77 | 2604 | 14.21 | 4.87 | 29.26 | 8.40 |
| Example 7 from WO2011/048821 | 0.306 | 0.620 | 5.68 | 2943 | 16.30 | 4.70 | 33.60 | 9.60 |
| Comparative Example 1 from WO2011/048821 | 0.316 | 0.612 | 6.54 | 1931 | 9.29 | 5.89 | 20.74 | 5.94 |

TABLE 1-continued

| | 1931 CIE | | At 10 mA/cm² | | | At 1000 nits | | |
|---|---|---|---|---|---|---|---|---|
| Device # | x | y | Voltage (V) | Luminance (cd/m²) | Power Efficiency (lm/W) | Voltage (V) | LE (cd/A) | EQE (%) |
| Comparative Example 2 from WO2011/048821 | 0.312 | 0.613 | 5.89 | 1896 | 10.23 | 5.28 | 20.23 | 5.76 |

Despite the recent discoveries of efficient heavy metal phosphors and the resulting advancements in OLED technology, there remains a need for longer device stability. Fabrication of devices that have longer lifetimes will contribute to the development of new OLED based display technologies and help realize the current goals toward full color electronic display on flat surfaces. An improved OLED device that exhibit improved lifetime is disclosed herein along with the host materials, phosphorescent emitter materials and hole transport materials that may be used to construct such OLED.

As used herein, the term "organic" includes polymeric materials as well as small molecule organic materials that may be used to fabricate organic opto-electronic devices. As used herein, "small molecule" refers to any organic material that is not a polymer, i.e., organic material having molecules with a defined molecular weight, and "small molecules" may actually be quite large. Small molecules may include repeat units in some circumstances, e.g. oligomers. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

SUMMARY OF THE INVENTION

According to an embodiment of the present disclosure, an OLED is disclosed. The device comprises an anode, a cathode and a plurality of organic layers sandwiched between them. The plurality of organic layers comprising an emitter layer that can include a host material and a phosphorescent emitter material. The phosphorescent emitter material comprising a phosphorescent organometallic compound that emits phosphorescent radiation from a triplet molecular excited state when a voltage is applied across the emitter layer. The plurality of organic layers further comprises a first hole transport layer disposed between the emitter layer and the anode and a second hole transport layer disposed between the first hole transport layer and the anode. The first hole transport layer comprising a first hole transport material of represented by the following general formula (HTL1)

(HTL1)

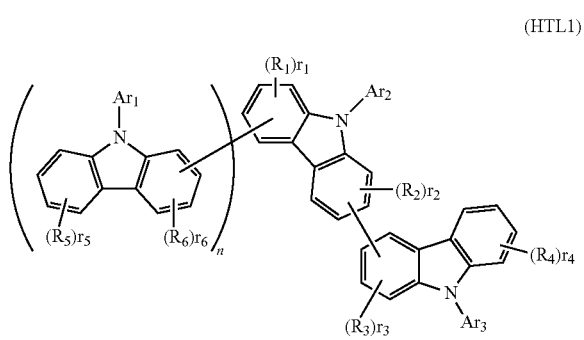

wherein $R_1$, $R_2$, $R_3$, $R_4$, $R_5$, and $R_6$ may be the same or different fluoric atom, chlorine atom, a deuterium atom, a cyano group, a trifluoromethyl group, a nitro group, linear or branched alkyl group (C1-C6), cyclo-alkyl group (C5-C10), linear or branched alkoxy group (C1-C6), cyclo-alkoxy group (C5~C10), substituted or unsubstituted aromatic hydrocarbon group, substituted or unsubstituted aromatic heterocyclic group, substituted or unsubstituted condensed polycyclic aromatic group, $r_1$, $r_4$, $r_5$=0, 1, 2, 3, or 4, $r_2$, $r_3$, $r_6$; =0, 1, 2 or 3, n=0 or 1, and $Ar_1$, $Ar_2$, and $Ar_3$ may be the same or different, substituted or unsubstituted aromatic hydrocarbon group, substituted or unsubstituted aromatic heterocyclic group, substituted or unsubstituted condensed polycyclic aromatic group, deuterium substituted aromatic hydrocarbon group, deuterium substituted aromatic heterocyclic group, or deuterium substituted condensed polycyclic aromatic group. The second hole transport layer comprising a second hole transport material that is different from the first hole transport material. The phosphorescent organometallic compound is a heteroleptic compound represented by the formula $L_2MX$, LL'MX, LL'L"M, or LMXX', wherein L, L', L", X, and X' are inequivalent, bidentate ligands and M is a metal that forms octahedral complexes, wherein L, L', and L" are monoanionic inequivalent bidentate ligands coordinated to M through an $sp^2$ hybridized carbon and a heteroatom.

The inventors have discovered that the OLED incorporating the teachings of the present disclosure exhibits an unexpectedly substantial improved working lifetime characteristics and improved luminous efficiency.

DETAILED DESCRIPTION

The present disclosure describes an OLED in which a combination of a phosphorescent emitter dopant material, its associated host material, and two hole transport layers each comprising a different hole transport material are utilized to extend the lifetime of the OLED and increase luminous efficiency. Operational stability is a tremendous advantage in OLED displays and lighting applications.

Figure 1:
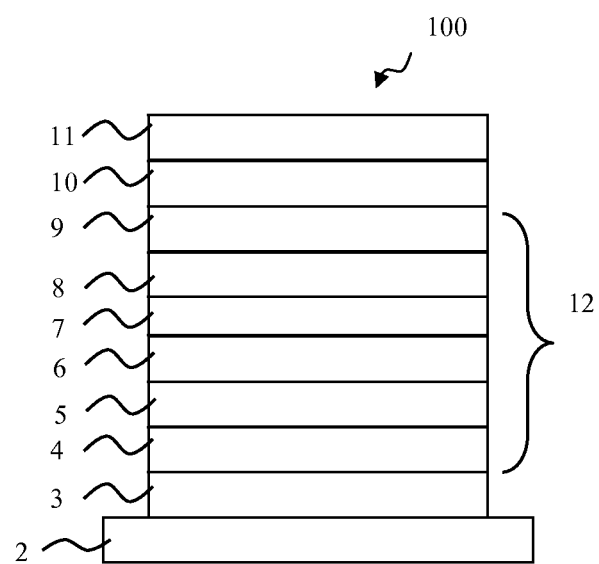
FIG. 1 is a schematic drawing showing an outline constitution of one example of the OLED according to one embodiment of the present invention. The drawing is not drawn to scale.

Referring to FIG. 1, an OLED 100 according to an embodiment of the present disclosure is disclosed. The OLED 100 can include a substrate 2, an anode 3, a cathode 11 and a plurality of organic layers 12 sandwiched between them. The plurality of organic layers comprise an emitter layer 7 that can include a host material and a phosphorescent emitter dopant material. In one preferred embodiment, the phosphorescent emitter material comprises a phosphorescent organometallic compound that emits phosphorescent radiation from a triplet molecular excited state when a voltage is applied across the emitter layer 7 via the two electrodes, the anode and the cathode. The device can further comprise a first hole transport layer 6, a second hole transport layer 5, and a hole injection layer 4 disposed between the emitter layer 7 and the anode 3 in an arrangement as shown. The device can further comprise a hole blocking layer 8, electron transport layer 9, and an electron injection layer 10 disposed between the emitter layer 7 and the canode 11. In another embodiment, an electron blocking layer (not shown) can be provided between the emitter layer 7 and the first hole transport layer 6. The hole blocking layer 8 and the electron blocking layer make it possible to contain electrons and holes in the phosphorescence emitter layer 7 to enhance the production rate of excitons in the phosphorescence emitter layer. The structure illustrated is an example only and the OLED according to the disclosed invention is not limited to the particular structure and can include more layers or fewer layers or different combinations of the layers.

According to one preferred embodiment of the present disclosure the plurality of organic layers 12 comprises the emitter layer 7 that includes a host material and a phosphorescent emitter material. The phosphorescent emitter material comprising a phosphorescent organometallic compound that emits phosphorescent radiation from a triplet molecular excited state when a voltage is applied across the emitter layer. The plurality of organic layers 12 further comprises the first hole transport layer 6 disposed between the emitter layer 7 and the anode 3 and the second hole transport layer 5 disposed between the first hole transport layer 6 and the anode 3.

First Hole Transport Material:

The first hole transport layer 6 comprises a first hole transport material of a carbazole type compound represented by the following general formula (HTL1):

(HTL1)

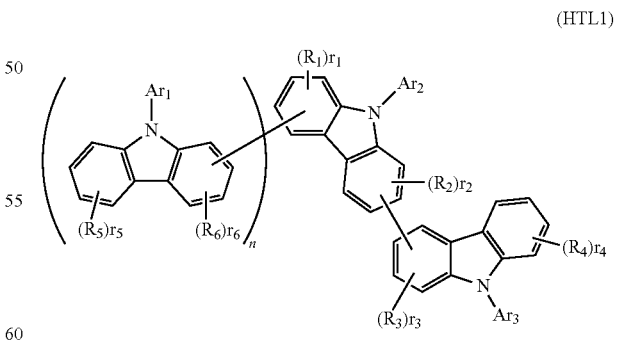

wherein $R_1$, $R_2$, $R_3$, $R_4$, $R_5$, and $R_6$ may be the same or different fluoric atom, chlorine atom, a deuterium atom, a cyano group, a trifluoromethyl group, a nitro group, linear or branched alkyl group (C1-C6), cyclo-alkyl group (C5-C10), linear or branched alkoxy group (C1-C6), cyclo-alkoxy group (C5~C10), substituted or unsubstituted aromatic hydrocarbon group, substituted or unsubstituted aromatic heterocyclic group, substituted or unsubstituted condensed polycyclic aromatic group, $r_1$, $r_4$, $r_5$=0, 1, 2, 3, or 4,
$r_2$, $r_3$, $r_6$; =0, 1, 2 or 3,
n=0 or 1, and $Ar_1$, $Ar_2$, and $Ar_3$ may be the same or different, substituted or unsubstituted aromatic hydrocarbon group, substituted or unsubstituted aromatic heterocyclic group, substituted or unsubstituted condensed polycyclic aromatic group, deuterium substituted aromatic hydrocarbon group, deuterium substituted aromatic heterocyclic group, or deuterium substituted condensed polycyclic aromatic group. The second hole transport layer 5 comprises a second hole transport material that is different from the first hole transport material.

Examples of compounds having the structure of formula (HTL1) include:

Compound HTL1-1

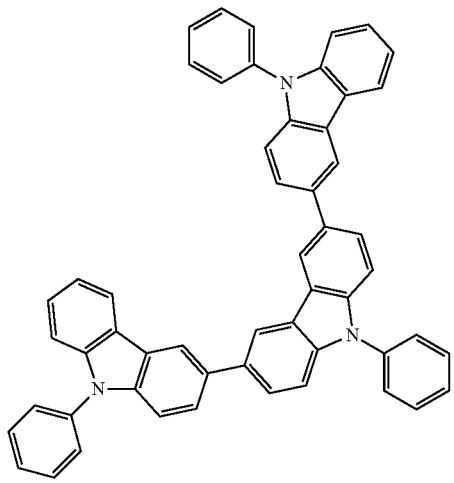

Compound HTL1-2

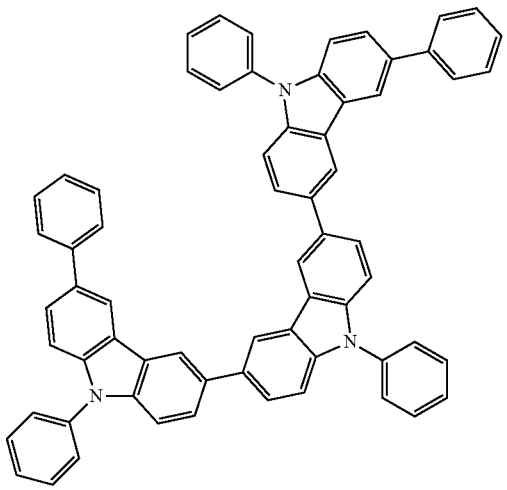

Compound HTL1-3

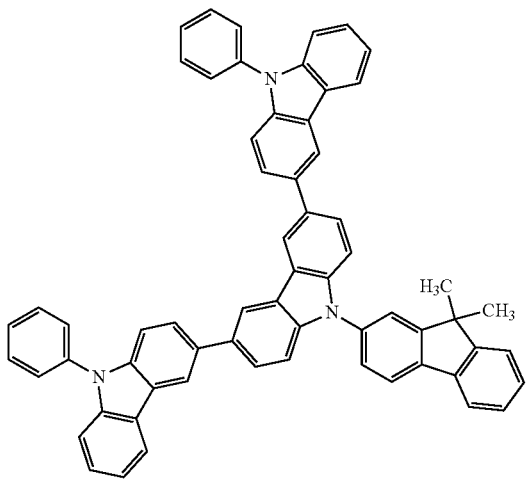

Compound HTL1-4

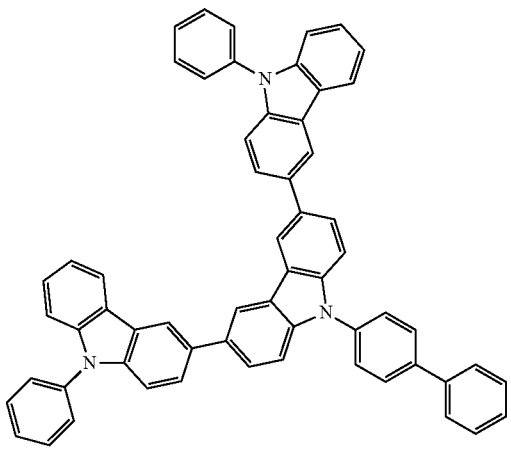

Compound HTL1-5

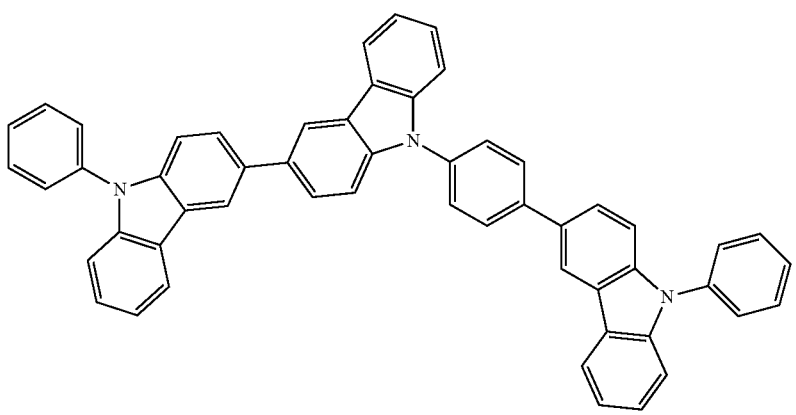

-continued
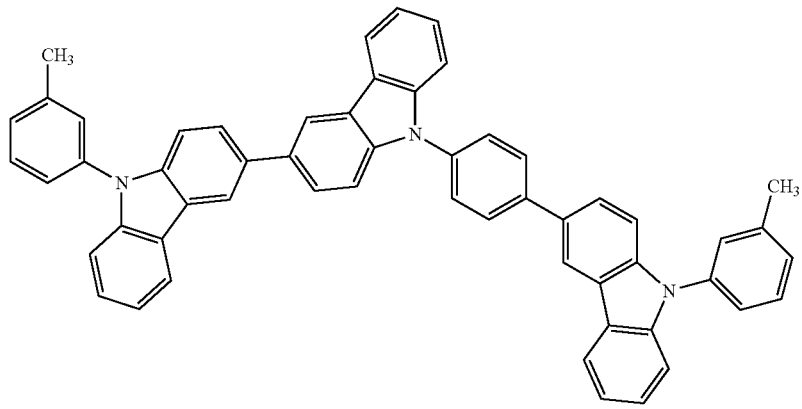
Compound HTL1-6
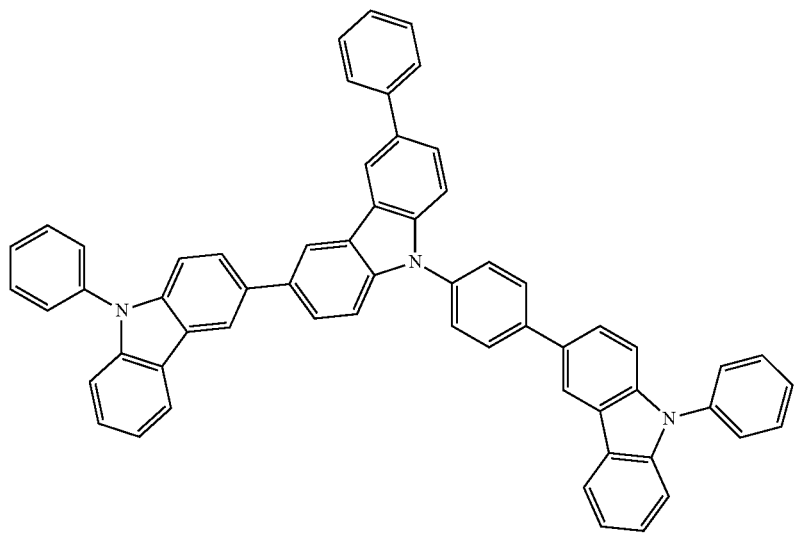
Compound HTL1-7
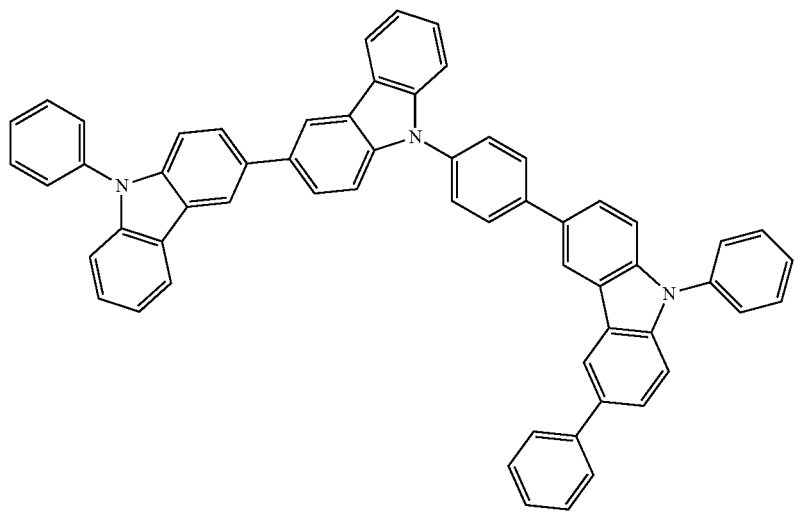
Compound HTL1-8

Compound HTL1-9
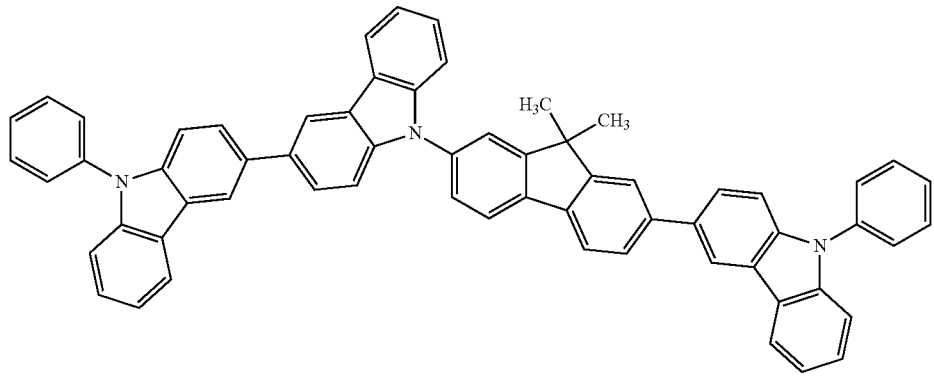
Compound HTL1-10
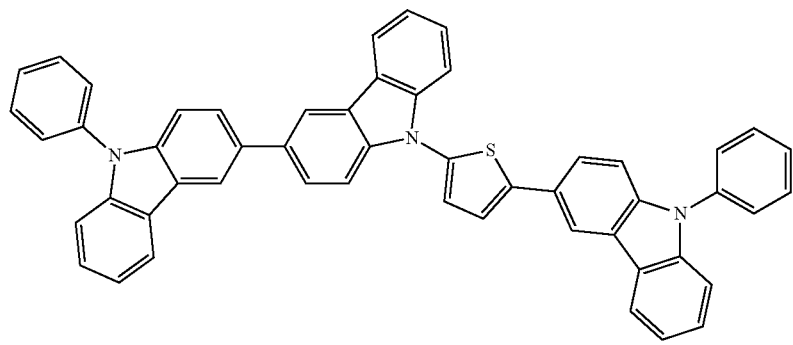
Compound HTL1-11
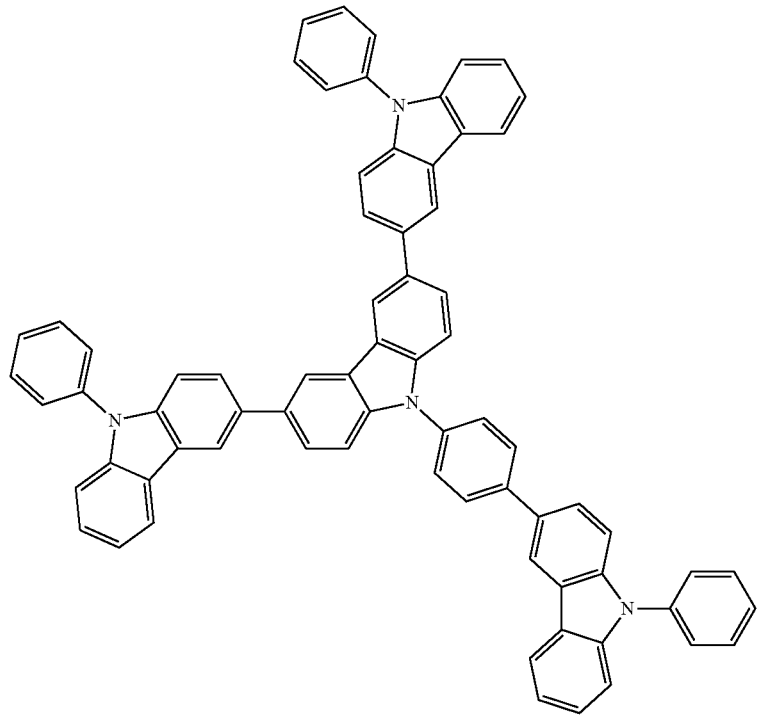

Compound HTL1-12

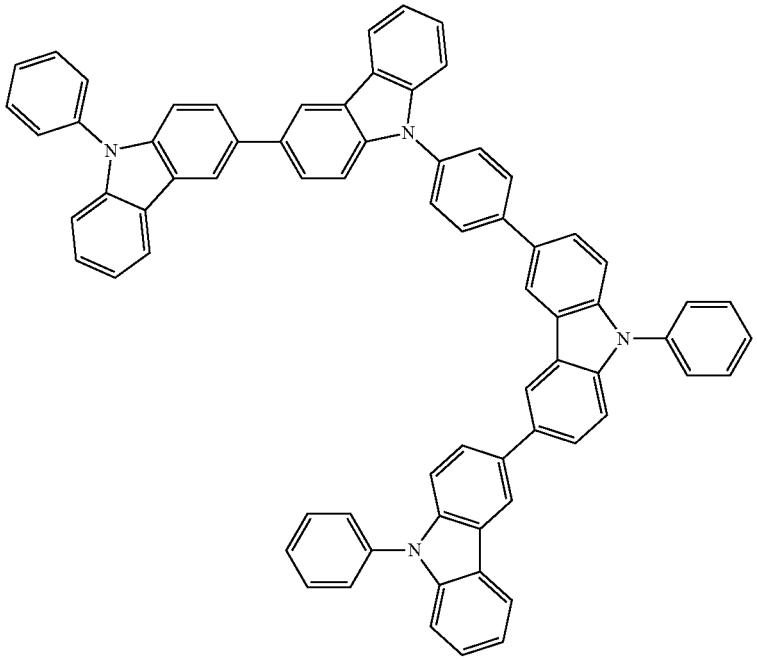

Compound HTL1-13

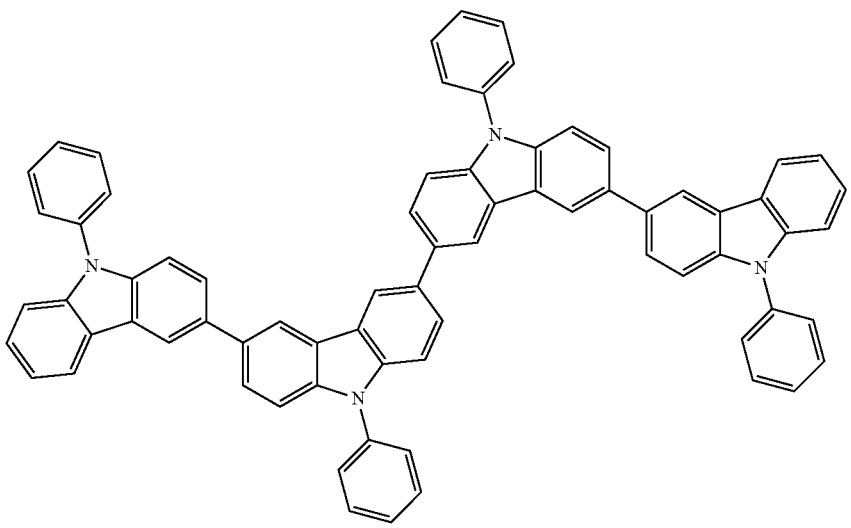

Synthesis Example 1: Synthesis of 3,6-Bis(9'-phenyl-9'H-carbazol-3-yl)-9-phenyl-9H-carbazole (Compound HTL1-1)

In a nitrogen atmosphere, 1.6 g of 3,6-Dibromo-9-phenyl-9H-carbazole, 2.4 g of 9-Phenyl-3-(4,4,5,5-tetramethyl-1,3,2-dioxaborolan-2-yl)-9H-carbazole, 0.23 g of tetrakistriphenylphosphine palladium, 6 ml of an aqueous 2 M potassium carbonate solution, 20 ml of toluene and 5 ml of ethanol were added to a reaction vessel, then heated, and stirred under refluxing for 5 hours. After cooling to 40° C., the insoluble materials was removed by filtration, and the filtrate was concentrated under reduced pressure to obtain a crude product. The crude product was purified by recrystallization (solvent: toluene/methanol) to obtain 1.76 g (yield: 60.9%) of 3,6-Bis(9'-phenyl-9'H-carbazol-3-yl)-9-phenyl-9H-carbazole (Compound HTL1-1) as a brownish white powder.

The structure of the obtained brownish white powder was identified using NMR. The following 35 hydrogen signals were detected on $^1$H-NMR (CDCl$_3$). δ (ppm)=8.56 (2H), 8.49 (2H), 8.24-8.26 (2H), 7.79-7.81 (4H), 7.62-7.67 (12H), 7.43-7.55 (11H), 7.30-7.33 (2H).

Synthesis Example 2: Synthesis of 9'-Phenyl-9-[4-(9-phenyl-9H-carbazol-3-yl)-phenyl]-9H,9'H-[3,3'] bicarbazolyl (Compound HTL1-5)

In a nitrogen atmosphere, 12.9 g of 9-Phenyl-9H,9'H-[3,3']bicarbazolyl, 13.4 g of 4-Bromoiodobenzene, 0.64 g of copper powder, 8.34 g of potassium carbonate, 0.49 g of sodium hydrogenesulfite and 50 ml of o-dichlorobenzene were added to a reaction vessel, then heated and stirred at 170° C. for 19.5 hours. After cooling to 90° C., 200 ml of toluene were added thereto and insoluble materials were removed by filtration. The filtrate was concentrated under reduced pressure to obtain a crude product, and the crude product was purified by recrystallization with methanol to obtain 17.3 g (yield: 97%) of 9-(4-Bromophenyl-9H,9'H-[3,3]bicarbazolyl as a white powder.

In a nitrogen atmosphere, 17.0 g of 9-(4-Bromophenyl-9H,9'H-[3,3']bicarbazolyl, 12.3 g of 9-Phenyl-3-(4,4,5,5-tetramethyl-1,3,2-dioxaborolan-2-yl)-9H-carbazole, 1.74 g of tetrakistriphenylphosphine palladium, 23 ml of an aqueous 2 M potassium carbonate solution, 160 ml of toluene and 40 ml of ethanol were added to a reaction vessel, then heated, and stirred under refluxing for 13 hours. After cooling to room temperature, 100 ml of toluene and 150 ml of water were added thereto, followed by stirring, and the organic layer was separated by liquid separation. The organic layer was dried over magnesium sulfate, and then concentrated under reduced pressure to obtain a crude product. The crude product was purified by column chromatography (carrier: silica gel, eluent: n-hexane/toluene) to obtain 10.4 g (yield: 48%) of 9'-Phenyl-9-[4-(9-phenyl-9H-carbazol-3-yl)-phenyl]-9H,9'H-[3,3]bicarbazolyl (Compound HTL1-5) as a slightly yellow powder.

The structure of the obtained slightly yellow powder was identified using NMR. The following 35 hydrogen signals were detected on $^1$H-NMR (THF-d$_8$). δ (ppm)=8.56-8.61 (3H), 8.26-8.30 (3H), 8.04-8.08 (2H), 7.81-7.85 (3H), 7.73-7.76 (2H), 7.64-7.69 (8H), 7.58 (1H), 7.48-7.53 (5H), 7.36-7.44 (5H), 7.25-7.31 (3H).

Second Hole Transport Material:

In another embodiment of the present disclosure, the second hole transport material can comprise at least one of the compounds having a formula selected from (HTL2-I) to (HTL2-VI) listed below:

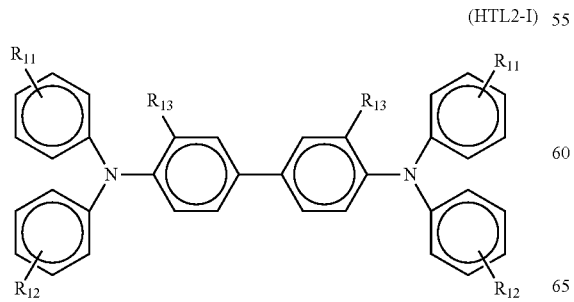
(HTL2-I)

wherein $R_{11}$ and $R_{12}$ may be the same or different and are independently selected from the group consisting of a hydrogen atom, a deuterium atom, a lower alkyl group, a lower alkoxy group, a phenyl group, a phenyl group having a lower alkyl group or deuterium substituent, and a phenyl group having a deuterium atom or a lower alkoxy group substituent with the proviso at least one of $R_{11}$ and $R_{12}$ is a deuterium atom, a normal butyl group, an isobutyl group, a secondary butyl group, a tertiary butyl group, a phenyl group, a phenyl group having a lower alkyl group substituent, or a phenyl group having a lower alkoxy group substituent; and $R_{13}$ represents a hydrogen atom, a deuterium atom, a lower alkyl group, a lower alkoxy group or a chlorine atom;

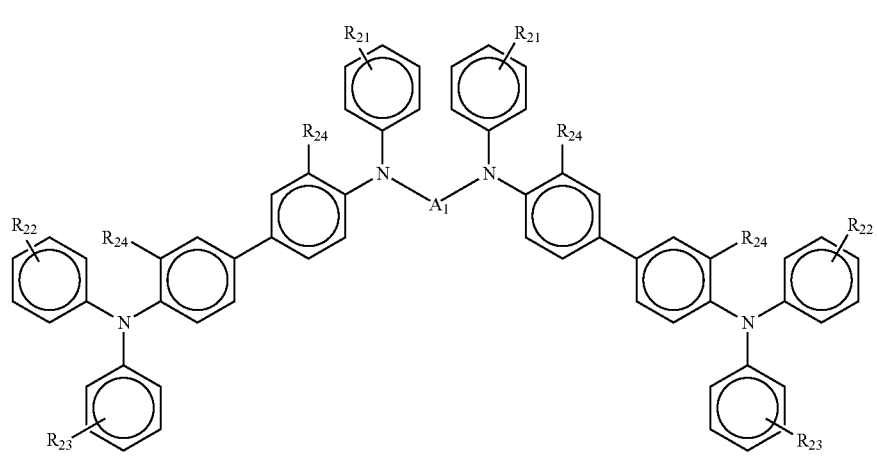
(HTL2-II)

wherein $R_{21}$, $R_{22}$ and $R_{23}$ may be the same or different and each represents a hydrogen atom, a deuterium atom, a lower alkyl group, a lower alkoxy group, an unsubstituted phenyl group, or a phenyl group having a lower alkyl group or a lower alkoxy group as a substituent(s); $R_{24}$ represents a hydrogen atom, a deuterium atom, a lower alkyl group, a lower alkoxy group or a chlorine atom; and $A_1$ represents a group represented by any one of the following structural formulae (a1) to (i1);

(a1)

(b1)

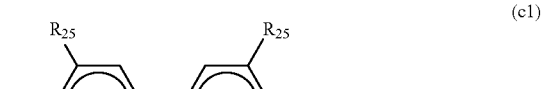
(c1)

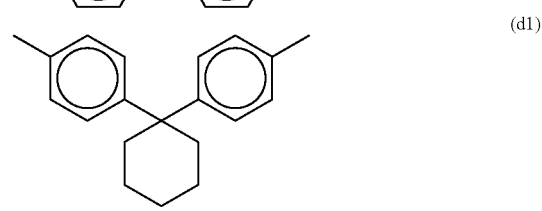
(d1)

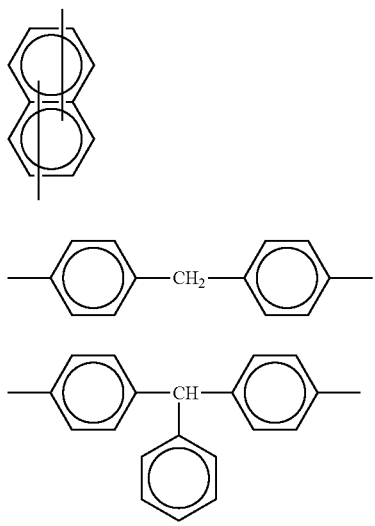

(e1)

(f1)

(g1)

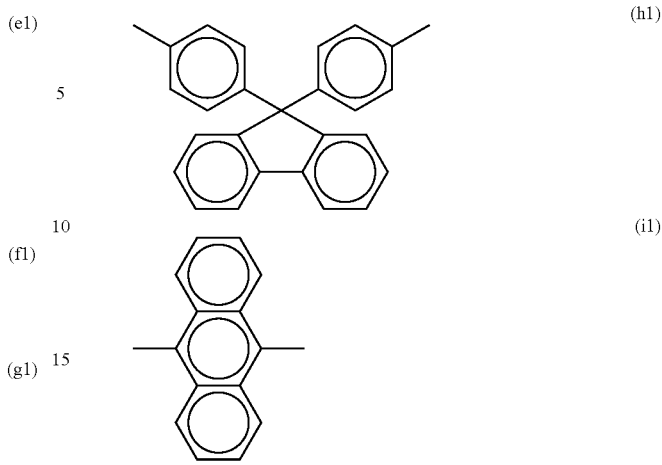

(h1)

(i1)

in which $R_{25}$ represents a hydrogen atom, a deuterium atom, a lower alkyl group, a lower alkoxy group or a chlorine atom;

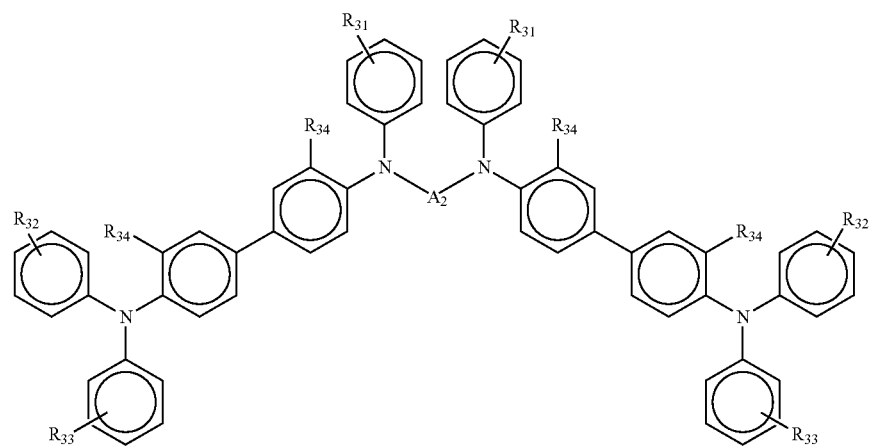

(HTL2-III)

wherein $R_{31}$, $R_{32}$ and $R_{33}$ may be the same or different and each represents a hydrogen atom, a deuterium atom, a lower alkyl group, a lower alkoxy group, an unsubstituted phenyl group, or a phenyl group having a deuterium atom, a lower alkyl group or a lower alkoxy group as a substituent(s); $R_{34}$ represents a hydrogen atom, a deuterium atom, a lower alkyl group, a lower alkoxy group or a chlorine atom; and
$A_2$ represents a group represented by any one of the following formulae (j1) to (n1);

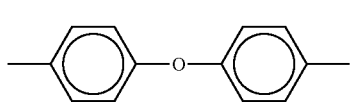

(j1)

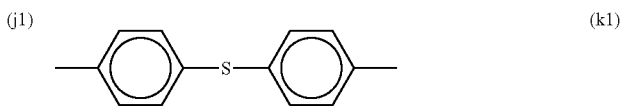

(k1)

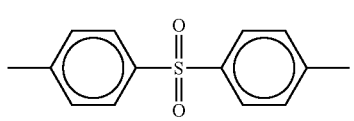

(l1)

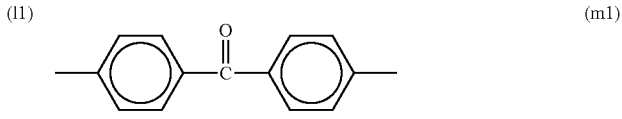

(m1)

-continued

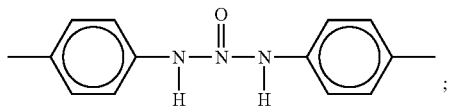
(n1)

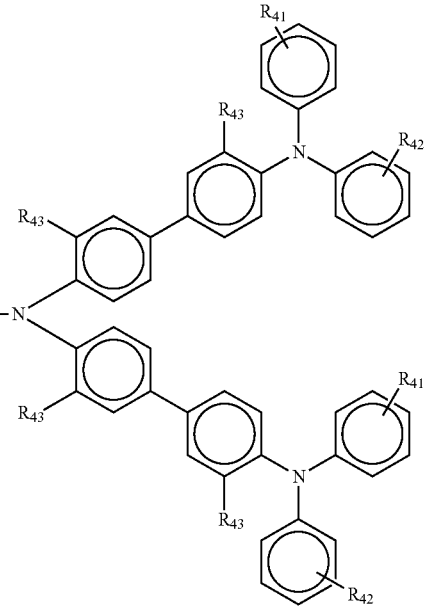
(HTL2-IV)

wherein $R_{41}$ and $R_{42}$ may be the same or different and each represents a hydrogen atom, a deuterium atom, a lower alkyl group, a lower alkoxy group, an unsubstituted phenyl group or a phenyl group having a deuterium atom, a lower alkyl group or a lower alkoxy group as a substituent(s); $R_{43}$ represents a hydrogen atom, a deuterium atom, a lower alkyl group, a lower alkoxy group or a chlorine atom; and $A_3$ represents a group represented by anyone of the following structural formulae (a2) to (i2);

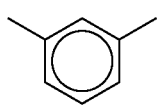
(a2)

(b2)

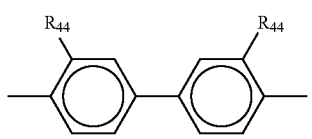
(c2)

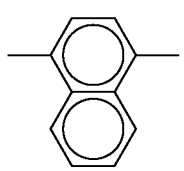
(d2)

-continued

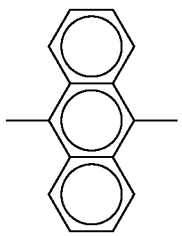
(e2)

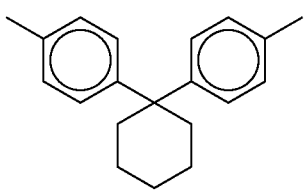
(f2)

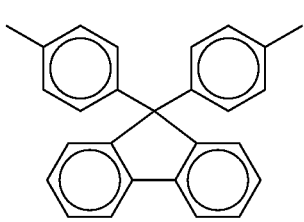
(g2)

-continued

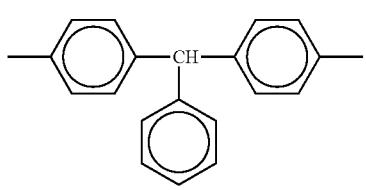
(h2)

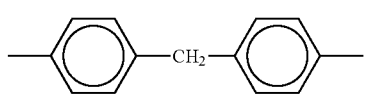
(i2)

in which R₄₄ represents a hydrogen atom, a deuterium atom, a lower alkyl group, a lower alkoxy group or a chlorine atom;

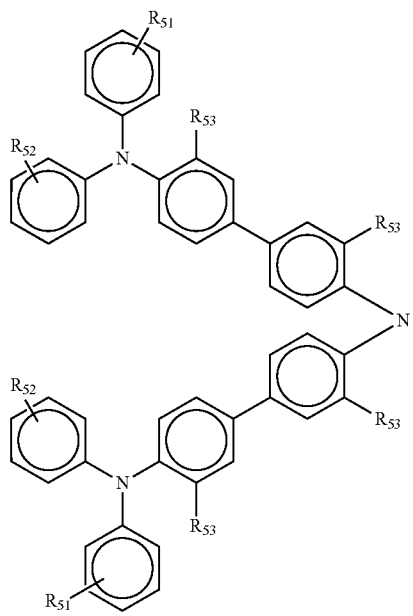
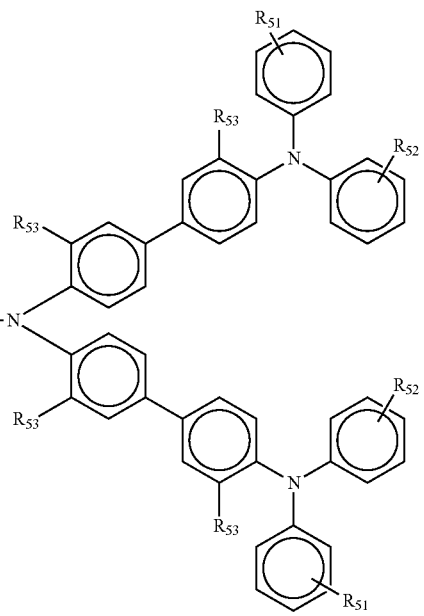
(HTL2-V)

wherein $R_{51}$ and $R_{52}$ may be the same or different and each represent a hydrogen atom, a deuterium atom, a lower alkyl group, a lower alkoxy group, an unsubstituted phenyl group or a phenyl group having a deuterium atom, a lower alkyl group or a lower alkoxy group as a substituent(s); $R_{53}$ represents a hydrogen atom, a deuterium atom, a lower alkyl group, a lower alkoxy group or a chlorine atom; and
$A_4$ represents a group represented by anyone of the following structural formulae (j2) to (n2);

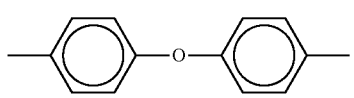
(j2)

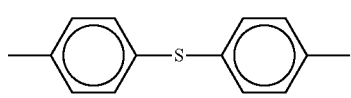
(k2)

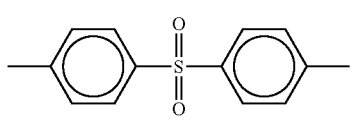
(l2)

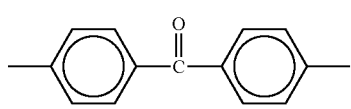
(m2)

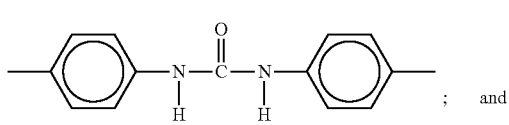
(n2)

; and (HTL2-VI)

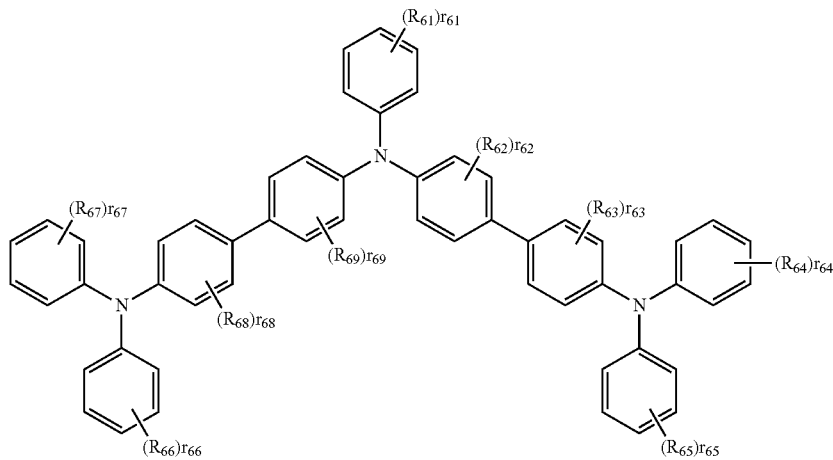

where $R_{61}$ to $R_{69}$, which may be the same or different, represent a hydrogen atom, a deuterium atom, a lower alkyl group, a lower alkoxy group, an unsubstituted aromatic hydrocarbon group, a phenyl group having a deuterium atom, a lower alkyl group or a lower alkoxy group; $r_{61}$ to $r_{69}$, which may be the same or different, represent 0, 1 or 2.

The terms "lower alkyl group" and "lower alkoxy group" as used herein mean "$C_{1-4}$ alkyl group" and "$C_{1-4}$ alkoxy group," respectively.

The synthesis information for the compounds of the formulae (HTL2-I) to (HTL2-V) and the specific examples of the compounds of formulae (HTL2-I) to (HTL2-V) are provided in U.S. Pat. No. 5,707,747 to Tomiyama et al., the contents of which are incorporated herein by reference.

Examples of compounds having the structure of formula (HTL2-VI) include:

Compound-1a

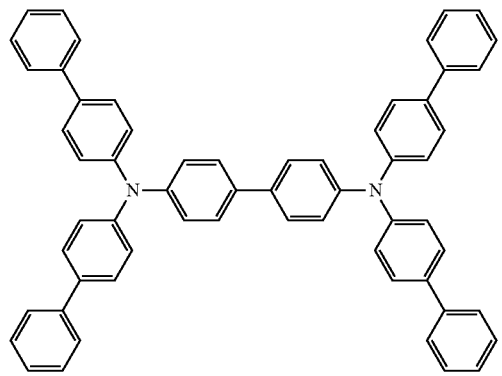

Compound-2a

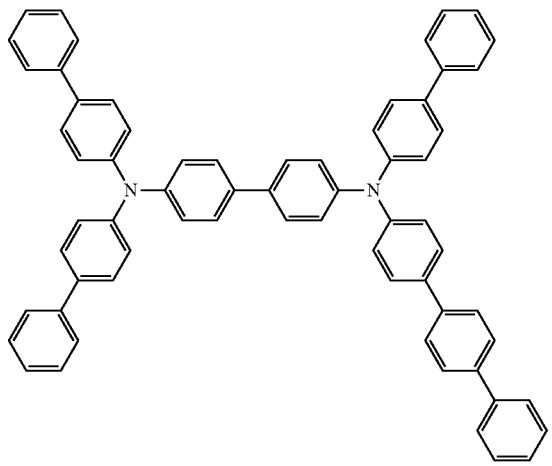

-continued
Compound-3a
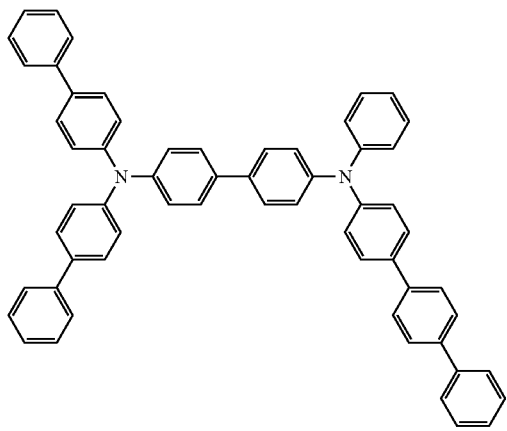
Compound-4a
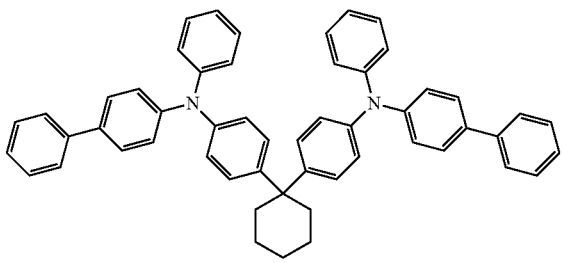
Compound-5a
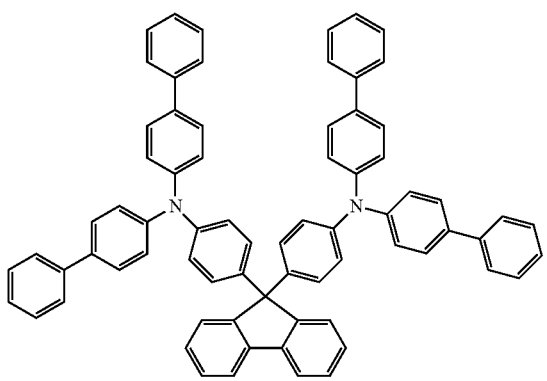
Compound-6a
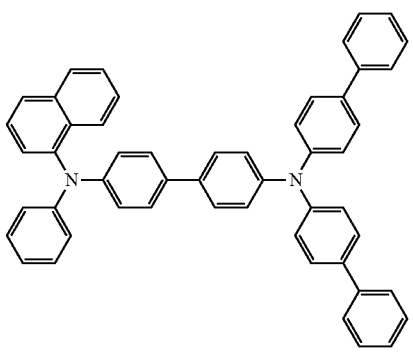
Compound-7a
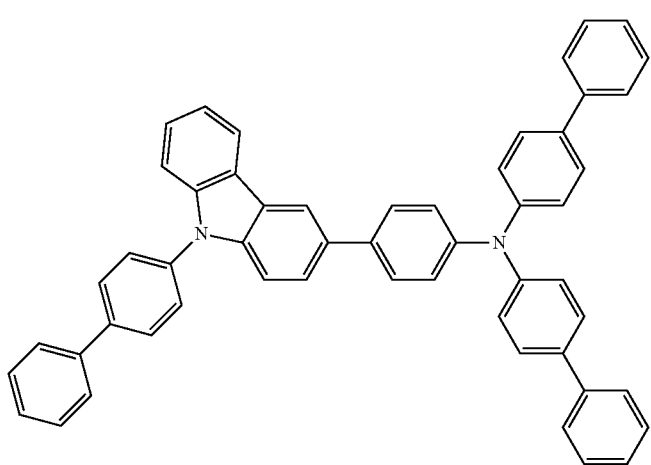

Compound-8a
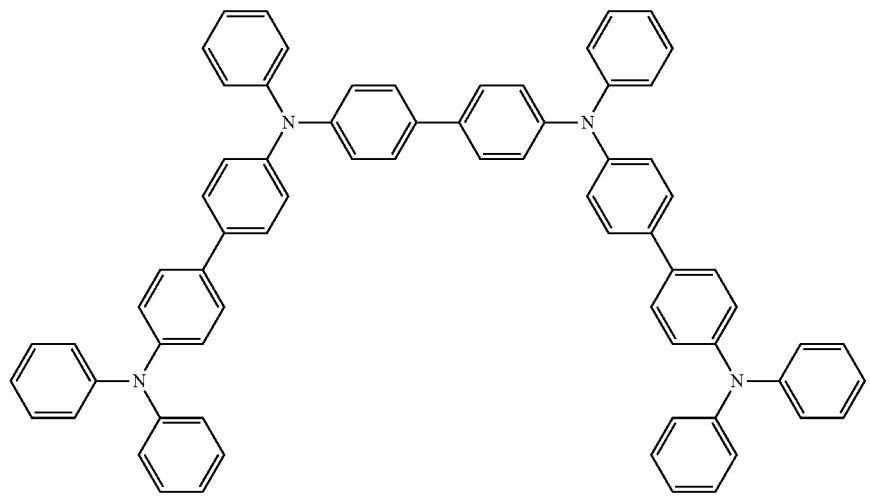
Compound-9a
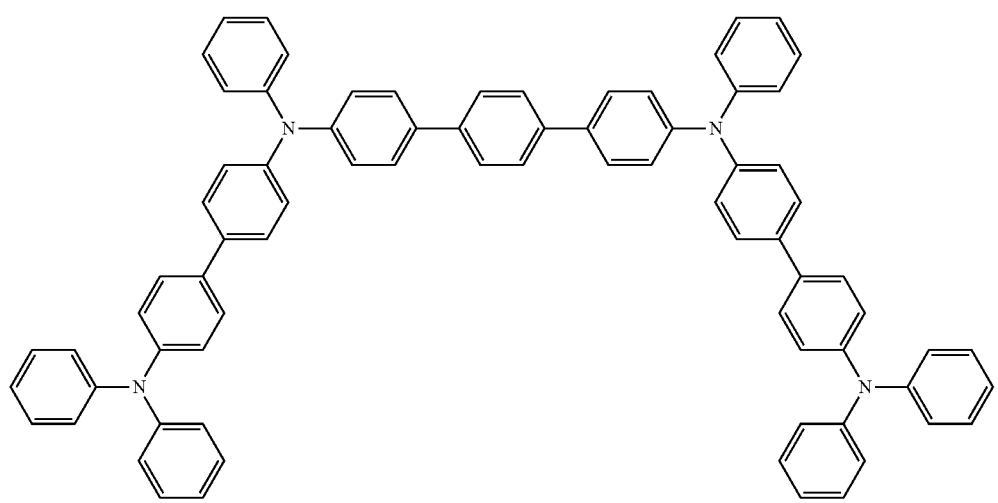
Compound-10a
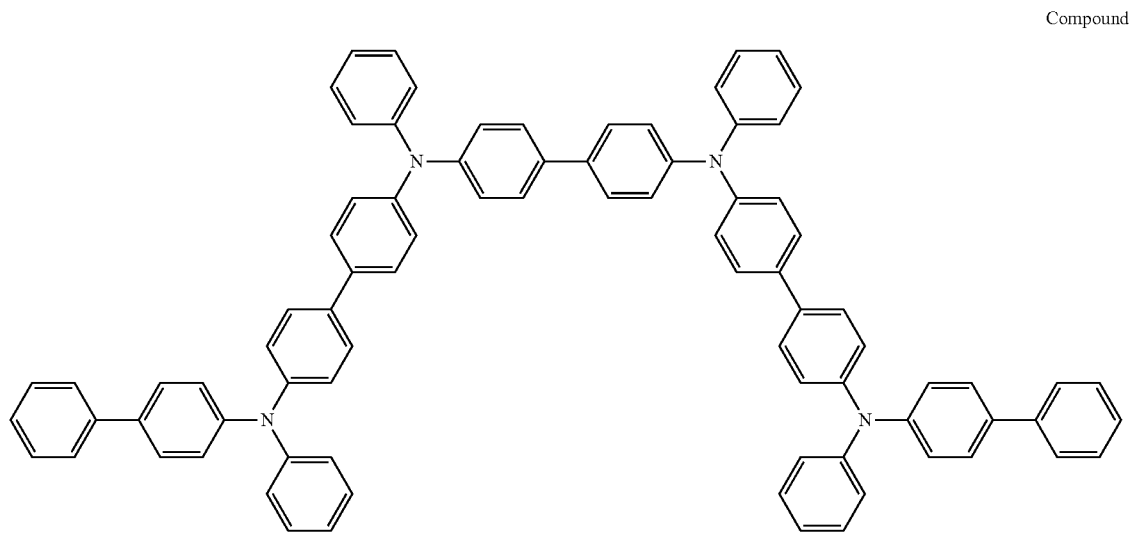

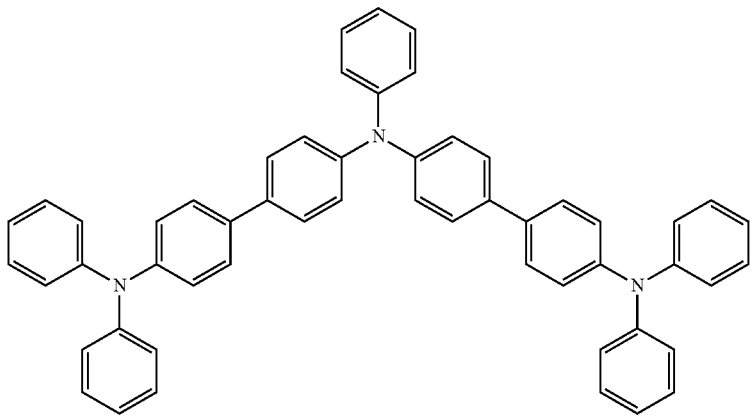

Compound-11a

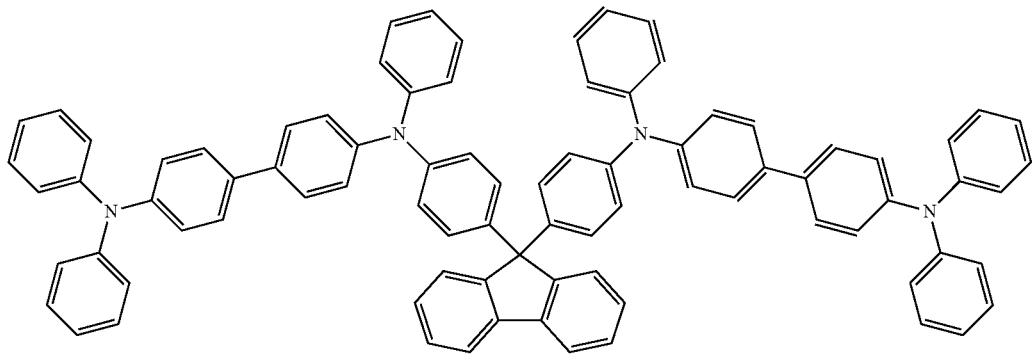

Compound-12a

Synthesis Example 1: Synthesis of N,N,N',N'-Tetrakis (biphenyl-4-yl)-4,4'-diaminobiphenyl (Compound 1a)

A mixture of bis(biphenyl-4-yl)amine 10.0 g (31.1 mmol), 4,4'-Diiodobiphenyl 5.28 g (30.0 mmol), anhydrous potassium carbonate 5.39 g (39.0 mmol), copper powder 0.083 g (1.3 mmol), dodecylbenzene 12 ml and xylene 24 ml was stirred and heated. After xylene was evaporated the mixture was reacted at 210-215° C. for 4 hours. Furthermore copper powder 0.083 g (1.3 mmol) was added to the mixture, additional reaction was proceeded for 4.5 hours. After cooling to 90° C., toluene was added to the reaction mixture, and the reaction mixture was cooled to room temperature. The reaction mixture was filtered and washed with water, methanol and toluene. The residue was extracted with hot toluene and toluene solution was concentrated to dry-up in vacuo. The crude product obtained was purified by recrystallization. 7.38 g (yield: 71.7%) of N,N,N',N'-Tetrakis (biphenyl-4-yl)-4,4'-diaminobiphenyl (Compound 1a) was obtained. The melting point was 265° C.

Synthesis Example 2: Synthesis of 4',4"-bis[bis(4-biphenylyl)amino]-9,9-diphenylfluorene (Compound 5a)

A mixture of bis(biphenyl-4-yl)amine 20.30 g (63.16 mmol), 9,9-bis(4-iodophenyl)fluorene 15.0 g (26.31 mmol), anhydrous potassium carbonate 10.91 g (78.92 mmol), copper powder 0.17 g (2.63 mmol) and dodecylbenzene 30 ml was stirred and heated at 200° C. for 13 hours under nitrogen gas. The reacting mixture was analyzed by HPLC, it was confirmed that the monoiodo-compound of intermediates was 1% or less, and assumed a reactive end. Toluene 100 ml was added to the reaction mixture and filtered. A residue was washed with methanol and water. The residue was added in chlorobenzene 2000 ml and heated to 120° C. After cooling to 60° C. the mixture was filtered and the filtrate was concentrated to dry up. The crude product obtained was purified by recrystallization by chlorobenzene for 3 times. The purified product, 4',4"-bis[bis(4-biphenylyl)amino]-9,9-diphenylfluorene (Compound 5a) was 17.9 g of gray-white powder. Yield was 71% and melting point was 324-326° C.

Synthesis Example 3: Synthesis of N,N'-Bis[4'-(diphenylamino) biphenyl-4-yl]-N,N'-diphenyl-4,4'-diaminobiphenyl (Compound 8a)

Acetanilide 20.3 g (0.15 mol), 4,4'-diiodobiphenyl 73.1 g (0.18 mol), anhydrous potassium carbonate 22.1 g (0.16 mol), copper powder 2.16 g (0.034 mol) and nitrobenzene 35 ml were mixed. The reaction mixture was stirred for 10 hours at 190-205° C. The reaction mixture was extracted with toluene 200 ml. The insoluble matters were removed by filtration. The filtrate was concentrated to dry-up. The crude product obtained was purified by column chromatography (carrier was silica gel and eluent was 6/1 mixture of toluene and ethyl acetate). 40.2 g (yield: 64.8%) of N-(4'-iodo-4-biphenylyl)acetanilide was obtained. A melting point of the product was 135.0-136.0° C.

Subsequently, N-(4'-iodo-4-biphenylyl)acetanilide 13.2 g (0.032 mol), diphenylamine 6.60 g (0.039 mol), anhydrous potassium carbonate 5.53 g (0.040 mol), copper powder 0.45 g (0.007 mol) and nitrobenzene 10 ml were mixed. The reaction mixture was stirred for 15 hours at 200-212° C. The reaction mixture was extracted with toluene 100 ml. The insoluble matters were removed by filtration. The filtrate was concentrated to dry-up. An oily matter was obtained. The oily matter was dissolved in isoamyl alcohol 60 ml. The material was hydrolyzed with water 1 ml and 85% potassium hydroxide 2.64 g (0.040 mol) at 130° C. The reaction solution was then distilled by steam distillation to remove isoamyl alcohol. The residue was extracted with toluene 250 ml, toluene solution was washed with water and concentrated to dry-up. The crude product obtained was purified by column chromatography (carrier was silica gel and eluent was ½ mixture of toluene and n-hexane). 10.5 g (yield: 72.2%) of N,N,N'-triphenyl-4,4'-diaminobiphenyl was obtained. The compound melted at 167.5-168.5° C.

N,N,N'-Triphenyl-4,4'-diaminobiphenyl 8.66 g (0.021 mol), 4,4'-diiodobiphenyl 4.06 g (0.01 mol), anhydrous potassium carbonate 2.90 g (0.021 mol), copper powder 0.32 g (0.005 mol) and nitrobenzene 10 ml were mixed. The reaction mixture was stirred at 195-210° C. for 20 hours. The reaction mixture was extracted with toluene 140 ml. The insoluble matters were removed by filtration. The filtrate was concentrated and a crude product was obtained. n-Hexane 120 ml was added to the crude product to recover a crude crystal. The crude crystal was purified by column chromatography (carrier was silica gel and eluent was ½ mixture of toluene and n-hexane). 4.73 g (yield: 48.5%) of N,N'-Bis[4'-(diphenylamino) biphenyl-4-yl]-N,N'-diphenyl-4,4'-diaminobiphenyl (Compound 8a) was obtained. The melting point of the product was 242.5-243.5° C.

The result of elementary analysis on the product was as follows:
The theoretical value: (carbon 88.67%) (hydrogen 5.58%) (nitrogen 5.75%)
Actual measurement value: (carbon 88.75%) (hydrogen 5.70%) (nitrogen 5.68%)

Synthesis Example 4: Synthesis of 4',4''-Bis[N-(4'-diphenylaminobiphenyl-4-yl)-N-phenyl-amino]-9,9-diphenylfluorene (Compound 12a)

4',4''-Bis[(4'-phenylaminobiphenyl-4-yl)amino]-9,9-diphenylfluorene 8.4 g (10 mmol), iodobenzene 10.2 g (50 mmol), anhydrous potassium carbonate 8.3 g (60 mmol), copper powder 0.64 g (10 mmol), tridecane 100 ml were mixed and reacted for 10 hours at reflux temperature under nitrogen gas. The reaction mixture was extracted with toluene 120 ml and insoluble matters were removed with filtration. The filtrate was concentrated to dry up and crude product was obtained. The crude product was purified by column chromatography with silica gel. The purified product, 4',4''-Bis[N-(4'-diphenylaminobiphenyl-4-yl)-N-phenyl-amino]-9,9-diphenylfluorene (Compound 12a) was 5.4 g of white powder. Yield was 47% and melting point was 186-220° C.

The chemical structure of the obtained white powder was identified with 13C-NMR. In 13C-NMR, 24 peaks among 26 peaks that correspond to aromatic 84 carbon atoms were 120.03, 122.71, 123.20, 123.97, 124.13, 124.21, 124.41, 125.20, 126.14, 127.16, 127.29, 127.51, 128.12, 128.83, 128.92, 129.13, 134.62, 139.77, 139.94, 145.91, 146.45, 146.58, 147.58, 151.40 ppm and a peak of aliphatic carbon atom in fluorene 9-position was 64.56 ppm.

In addition, the result of elementary analysis on the obtained white powder was as follows:
The theoretical value: (carbon 89.6%) (hydrogen 5.5%) (nitrogen 4.9%)
Actual measurement value: (carbon 89.5%) (hydrogen 5.6%) (nitrogen 4.4%)

The chemical structure of compound-12b was identified from the results of 13C-NMR and the elementary analysis.

Emitter Dopant:

Some examples of the phosphorescent organometallic compound of the phosphorescent emitter material are heteroleptic compounds represented by the formula $L_2MX$, LL'MX, LL'L''M, or LMXX', wherein L, L', L'', X, and X' are inequivalent, bidentate ligands and M is a metal that forms octahedral complexes, wherein L, L', and L'' are monoanionic inequivalent bidentate ligands coordinated to M through an $sp^2$ hybridized carbon and a heteroatom.

The phosphorescent organometallic compound can also be a compound selected from the group consisting of phosphorescent organometallic platinum compounds, organometallic iridium compounds and organometallic osmium compounds. The phosphorescent organometallic compound can include a carbon-metal bond. The organometallic platinum compounds, iridium compounds and osmium compounds can each include an aromatic ligand.

The phosphorescent organometallic compounds can comprise heteroleptic complexes with extended conjugation on the heterocyclic ring. Examples of such heteroleptic iridium compounds are described in PCT publication No. WO 2010/028151, published on Mar. 11, 2010, the disclosure of which is incorporated herein by reference in its entirety.

In another embodiment of the present disclosure the OLED comprises at least one phosphorescent material in the light emitting layer, wherein the phosphorescent material has a maximum value of 500 nm or more and 720 nm or less in a light emitting wavelength.

Emitter Host:

The host material for the emitter layer can be a compound comprising a triphenylene containing benzo-fused thiophene. Triphenylene is a polyaromatic hydrocarbon with high triplet energy, yet high [pi]-conjugation and a relatively small energy difference between the first singlet and first triplet levels. This would indicate that triphenylene has relatively easily accessible HOMO and LUMO levels compared to other aromatic compounds with similar triplet energy (e.g., biphenyl). The advantage of using triphenylene and its derivatives as hosts is that it can accommodate red, green and even blue phosphorescent dopants to give high efficiency without energy quenching. Triphenylene hosts may be used to provide high efficiency and stability phosphorescent OLEDs (PHOLEDs). See Kwong and Alleyene, Triphenylene Hosts in Phosphorescent Light Emitting Diodes, 2006, 60 pp, US 2006/0280965 A1. Benzo-fused thiophenes may be used as hole transporting organic conductors. In addition, the triplet energies of benzothiophenes, namely dibenzo[b,d]thiophene (referred to herein as "dibenzothiophene"), benzo[b]thiophene and benzo[c]thiophene are relatively high. A combination of benzo-fused thiophenes and triphenylene as hosts in PHOLEDs may be beneficial. More specifically, benzo-fused thiophenes are typically more hole transporting than electron transporting, and triphenylene is more electron transporting than hole transporting. Therefore combining these two moieties in one molecule may offer improved charge balance which may improve device performance in terms of lifetime, efficiency and low voltage. Different chemical linkage of the two moieties can be used to tune the properties of the resulting compound to make it the most appropriate for a particular phosphorescent emitter, device architecture, and/or fabrication process. For example, m-phenylene linkage is expected to result in higher triplet energy and higher solubility whereas p-phenylene linkage is expected to result in lower triplet energy and lower solubility.

Similar to the characterization of benzo-fused thiophenes, benzo-fused furans are also typically hole transporting materials having relatively high triplet energy. Examples of benzo-fused furans include benzofuran and dibenzofuran. Therefore, a material containing both triphenylene and benzofuran may be advantageously used as host or hole blocking material in PHOLED. A compound containing both of these two groups may offer improved electron stabilization which may improve device stability and efficiency with low voltage. The properties of the triphenylene containing benzofuran compounds may be tuned as necessary by using different chemical linkages to link the triphenylene and the benzofuran.

The compounds may be substituted with groups that are not necessarily triphenylenes, benzo-fused thiophenes, and benzo-fused furans. Preferably, any group that is used as a substitutent of the compound has a triplet energy high enough to maintain the benefit of having triphenylene benzo-fused thiophenes or benzo-fused furans (i.e. the triplet energy of the substituent maintains the high triplet energy of benzo-fused thiophenes, benzo-fused furans and triphenylenes). Examples of such groups that may be used as substituents of the compound may include any unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, CH=CH—$C_nH_{2n+1}$, C=CHC$_nH_{2n+1}$, $Ar_1$, $Ar_1$—$Ar_2$, $C_nH_{2n}$-$A_{r1}$, or no substitution, wherein n is 1, 2, 3, 4, 5, 6, 7, 8, 9, or 10, and wherein $Ar_1$ and $Ar_2$ are independently selected from the group consisting of benzene, biphenyl, naphthalene, triphenylene, carbazole, and heteroaromatic analogs thereof. The compounds for the host material described herein have a high enough triplet energy to be suitable for use in a device having phosphorescent blue emissive materials.

The substituents of the compounds described herein are unfused such that the substituents are not fused to the triphenylene, benzo-fused furan or benzo-fused thiophene moieties of the compound. The substituents may optionally be inter-fused (i.e. fused to each other).

In addition to improved device stability and efficiency, the materials provided herein may also offer improved film formation in the device as fabricated by both vapor deposition and solution processing methods. In particular, materials offering improved fabrication have a central pyridine ring to which the benzo-fused thiophenylene and triphenylene, or benzofuran and triphenylene, are attached. The improved film formation is believed to be a result of the combination of polar and non-polar rings in the compound.

Examples of triphenylene-containing benzo-fused thiophenes include compounds having the structure of the following formulae (H-I), (H-II), and (H-III):

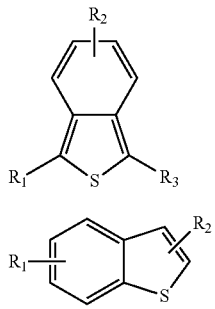

(H-I)

(H-II)

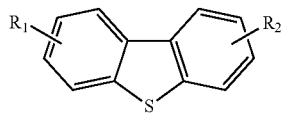

(H-III)

$R_1$, $R_2$ and $R_3$ are independently selected from alkyl, alkoxy, amino, alkenyl, alkynyl, aryalkyl, aryl, heteroaryl and hydrogen. Each of $R_1$, $R_2$ and $R_3$ may represent multiple substituents. At least one of $R_1$, $R_2$ and $R_3$ includes a triphenylene group. The triphenylene group may be linked directly to the structure of formulae (H-I), (H-II) or (H-III), but there may also be a "spacer" in between the triphenylene group and the structure of formulae (H-I), (H-II) or (H-III).

Examples of triphenylene-containing benzo-fused thiophenes or benzo-fused furans include compounds having the structure of the following formulae (H-IV), (H-V), and (H-VI):

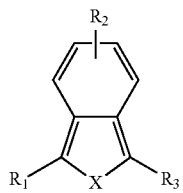

(H-IV)

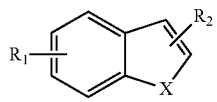

(H-V)

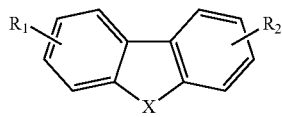

(H-VI)

X is S or O. Preferably, $R_1$, $R_2$ and $R_3$ are unfused substituents that are independently selected from $C_nH_{2n+1}$, $OC_nH_{2n+1}$, $OAr_1$, $N(C_nH_{2n+1})_2$, $N(Ar_1)(Ar_2)$, CH=CH—$C_nH_{2n+1}$, C=CHC$_nH_{2n+1}$, $Ar_1$, $Ar_1$—$Ar_2$, $C_nH_{2n}$-$A_{r1}$, or no substitution. Each of $R_1$, $R_2$ and $R_3$ may represent mono, di, tri, or tetra substitutions, n is 1, 2, 3, 4, 5, 6, 7, 8, 9, or 10. $Ar_1$ and $Ar_2$ are independently selected from the group consisting of benzene, biphenyl, naphthalene, triphenylene, carbazole, and heteroaromatic analogs thereof. At least one of $R_1$, $R_2$ and $R_3$ includes a triphenylene group.

Examples of compounds having the structure of the formula (H-I) include:

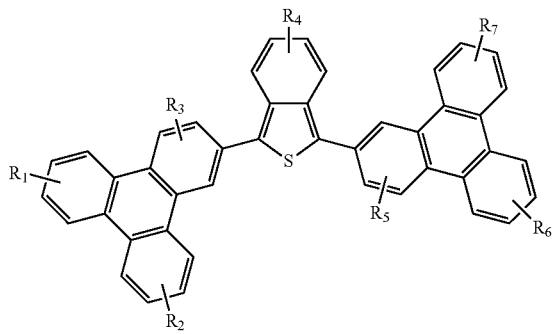

Compound 11'G

-continued

Compound 11'

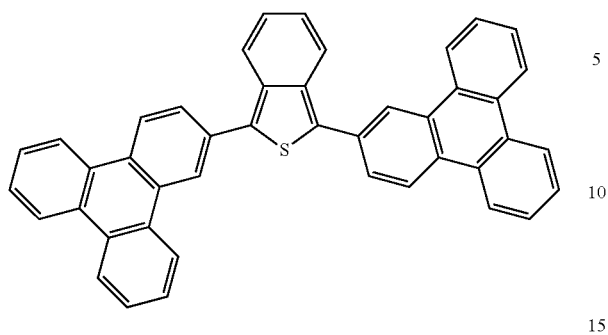

$R_1$ to $R_n$ represents, independently, mono, di, tri or tetra substitutions selected from alkyl, alkoxy, amino, alkenyl, alkynyl, aryalkyl, aryl and heteroaryl, or no substitution.

Examples of compounds having the structure of the formula (H-IV) include:

Compound 11G

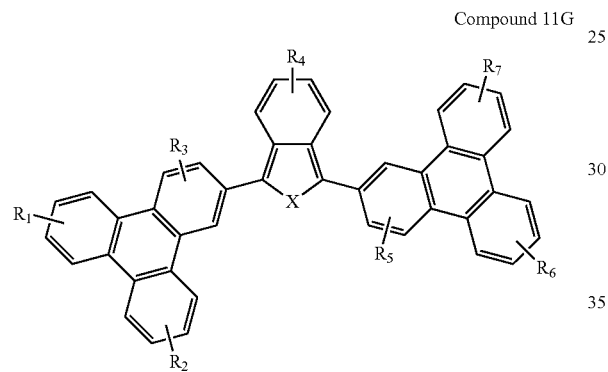

Compound 11

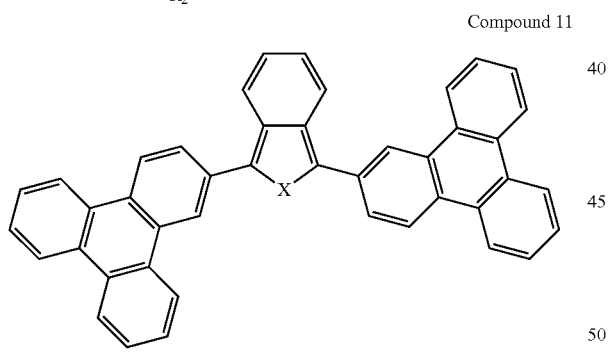

where X is S or O. Preferably, X is S. $R_1$ to $R_n$ are independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1-Ar_2$, $C_nH_{2n}-Ar_1$, or no substitution. Each of $R_1$ to $R_n$ may represent mono, di, tri, or tetra substitutions, n is 1, 2, 3, 4, 5, 6, 7, 8, 9, or 10. $Ar_1$ and $Ar_2$ are independently selected from the group consisting of benzene, biphenyl, naphthalene, triphenylene, carbazole, and heteroaromatic analogs thereof. At least one of $R_1$, $R_2$, and $R_3$ includes a triphenylene group.

Examples of compounds having the structure of the formula (H-II) include:

Compound 12'G

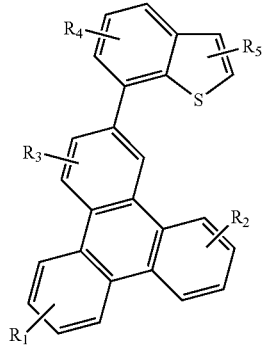

Compound 12'

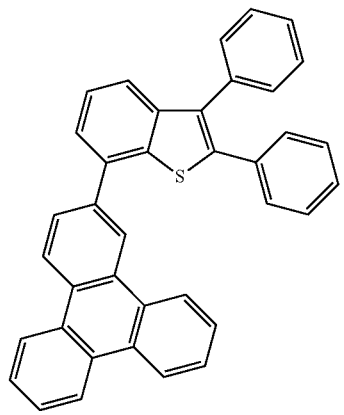

Compound 13'G

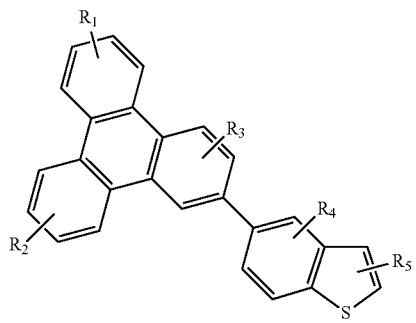

Compound 13'

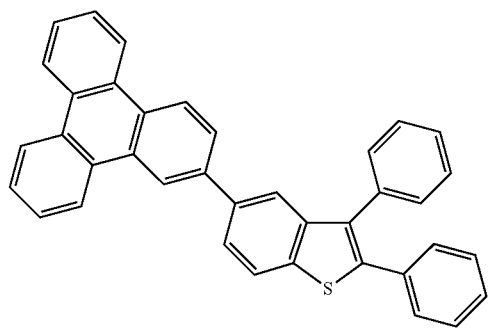

Compound 14'G
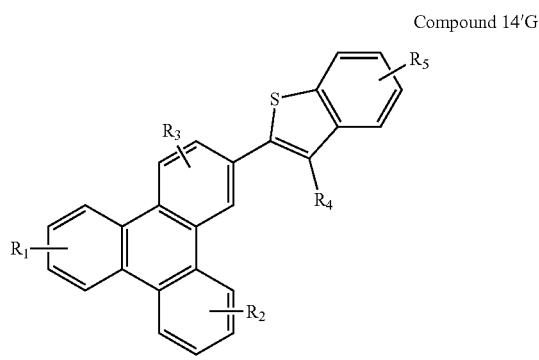
Compound 14'
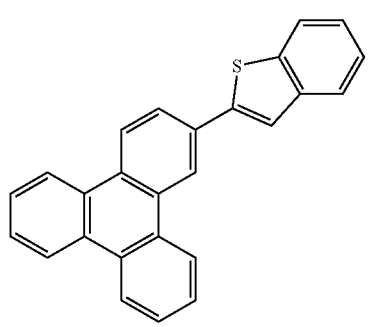
Compound 16'G
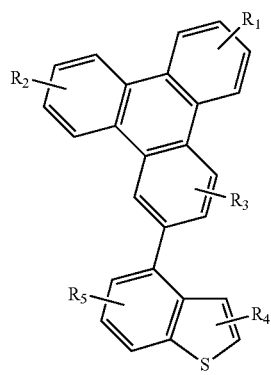
Compound 16'
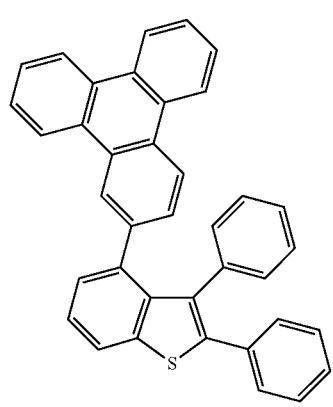
Compound 17'G
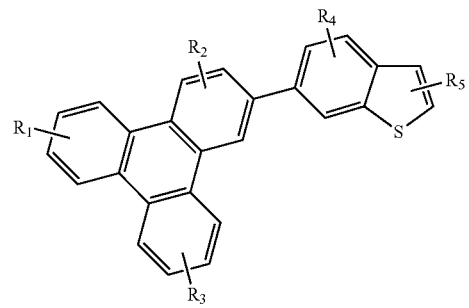
Compound 17'
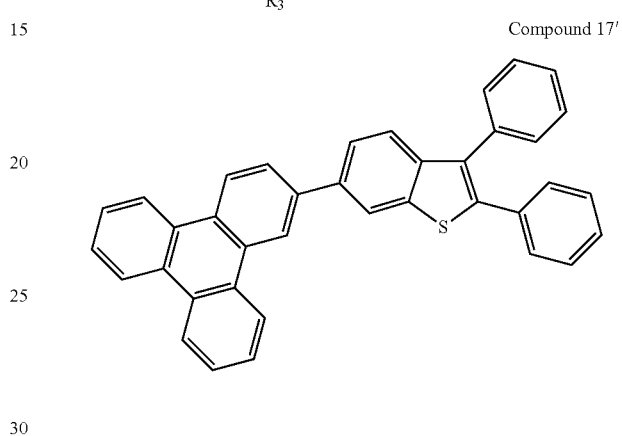
Compound 18'G
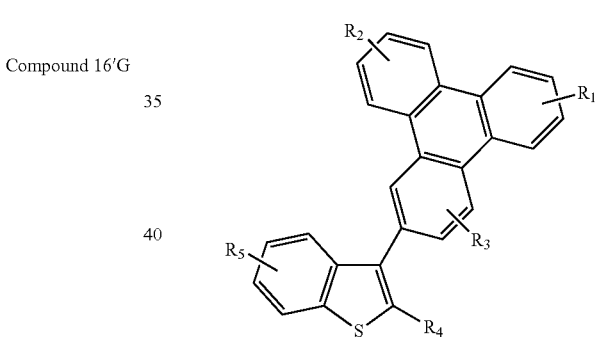
Compound 18'
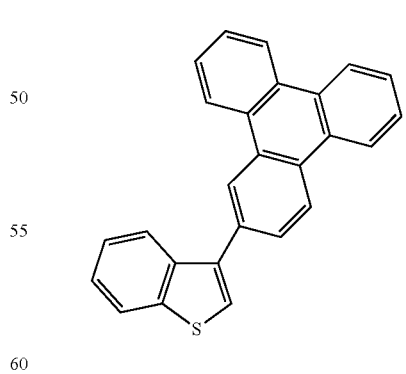
where $R_1$ to $R_n$ represents, independently, mono, di, tri or tetra substitutions selected from alkyl, alkoxy, amino, alkenyl, alkynyl, aryalkyl, aryl and heteroaryl, or no substitution.
Examples of compounds having the structure of the formula (H-V) include:

Compound 12G
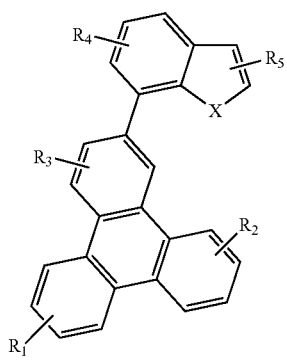
Compound 14G
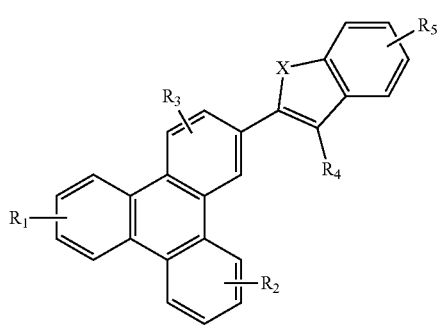
Compound 12
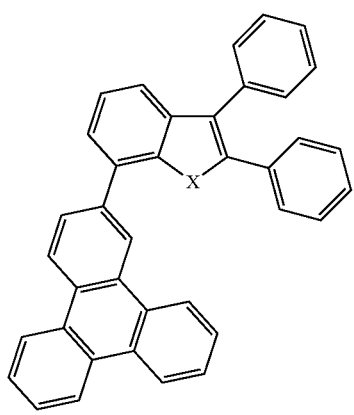
Compound 14
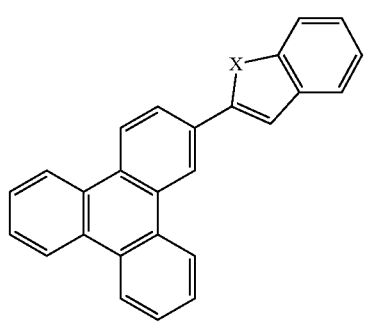
Compound 13G
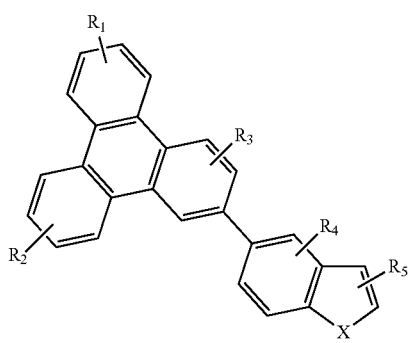
Compound 16C
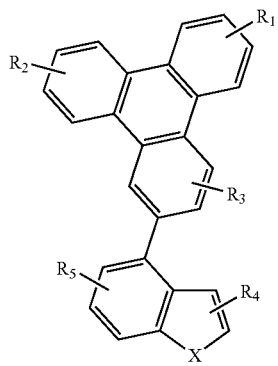
Compound 13
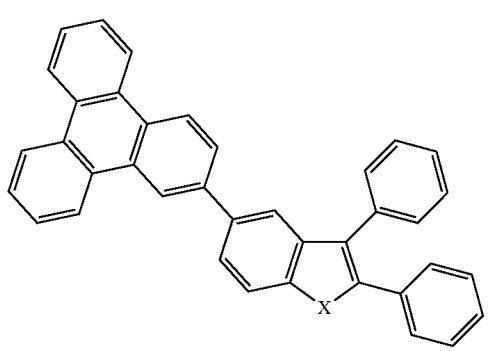
Compound 16
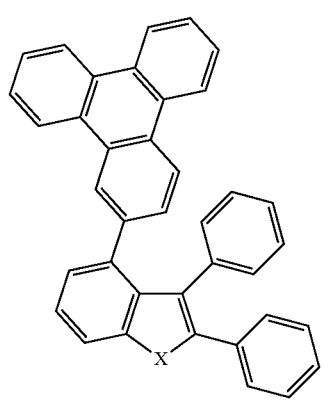

-continued

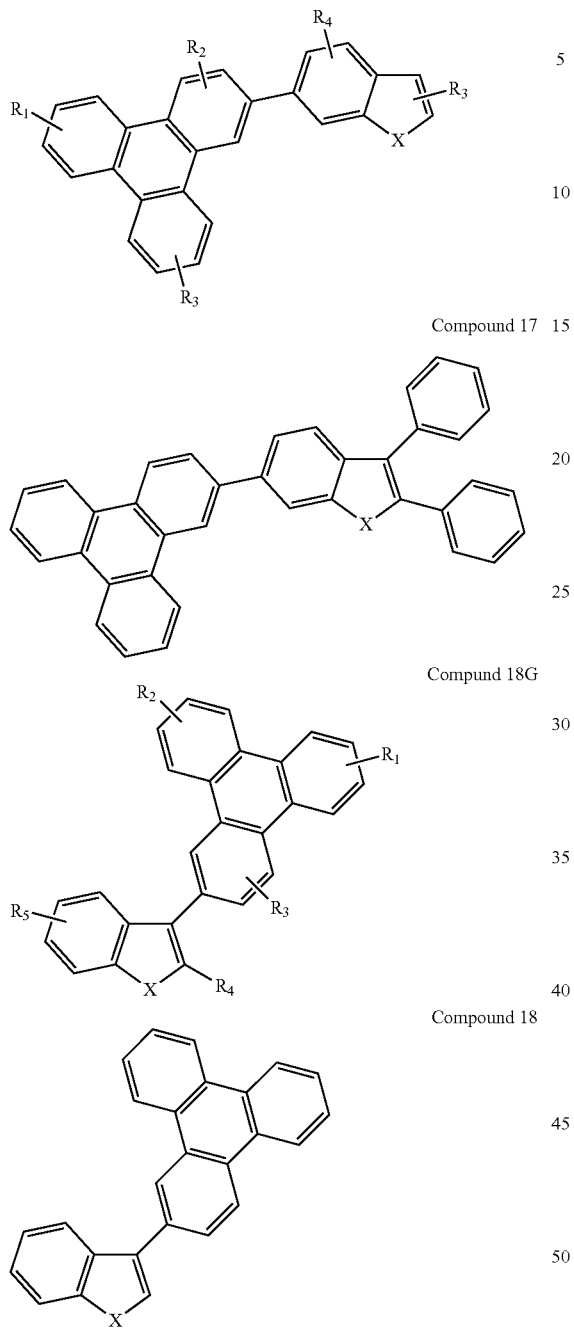

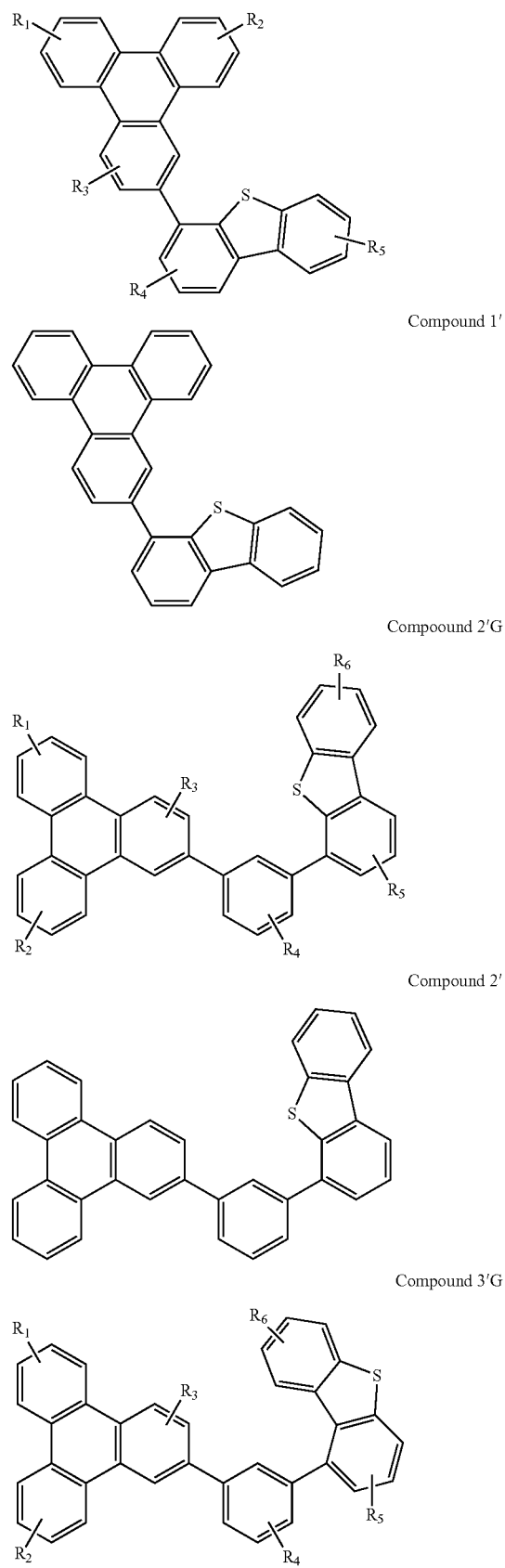

where X is S or O. Preferably, X is S. $R_1$ to $R_n$ are independently selected from the group consisting of $C_nH_{2n+1}$, $OC_nH_{2n+1}$, $OAr_1$, $N(C_nH_{2n+1})_2$, $N(Ar_1)(Ar_2)$, $CH\!=\!CH\!-\!C_nH_{2n+1}$, $C\!=\!CHC_nH_{2n+1}$, $Ar_1$, $Ar_1\!-\!Ar_2$, $C_nH_{2n}\text{-}A_{r1}$, or no substitution. Each of $R_1$ to $R_n$ may represent mono, di, tri, or tetra substitutions, n is 1, 2, 3, 4, 5, 6, 7, 8, 9, or 10. $Ar_1$ and $Ar_2$ are independently selected from the group consisting of benzene, biphenyl, naphthalene, triphenylene, carbazole, and heteroaromatic analogs thereof. At least one of $R_1$, $R_2$, and $R_3$ includes a triphenylene group.

Examples of compounds having the structure of the formula (H-III) include:

Compound 3'
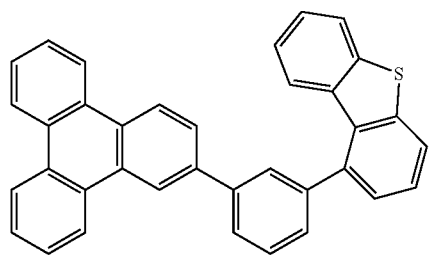
Compound 5'
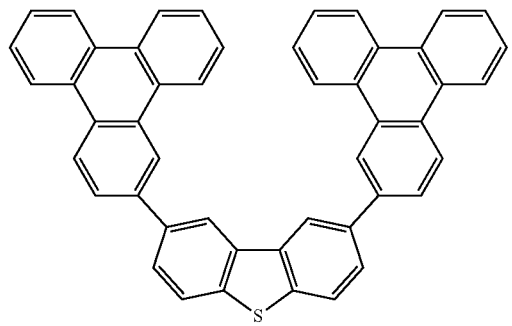
Compound 4'G
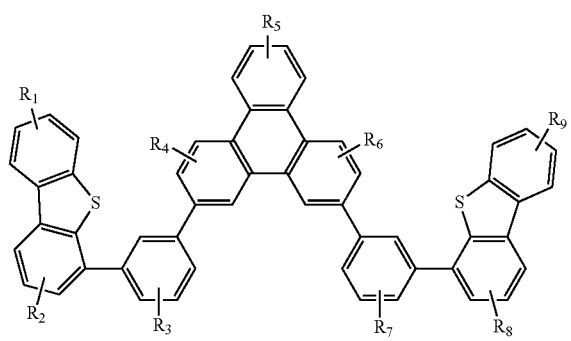
Compound 6'G
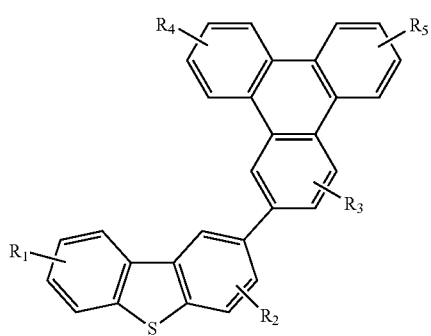
Compound 4'
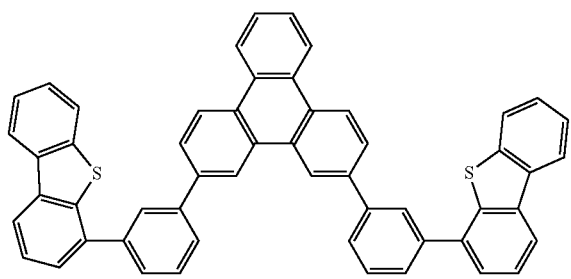
Compound 6'
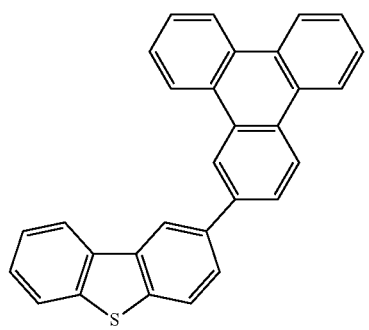
Compound 5'G
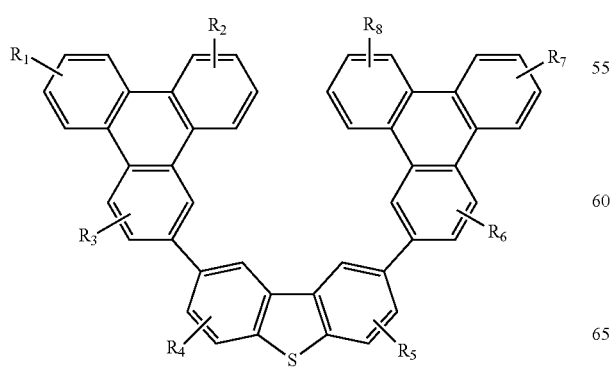
Compound 7'G
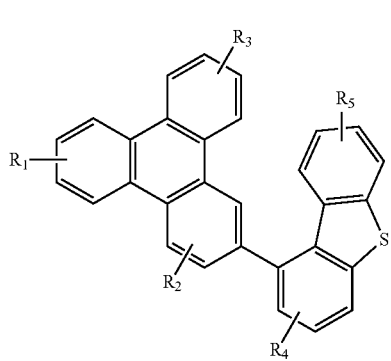

Compound 7'
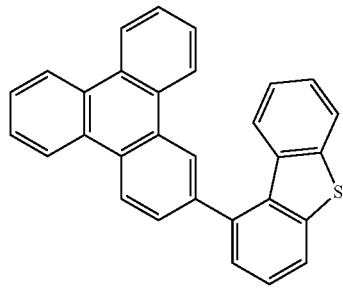
Compound 8'G
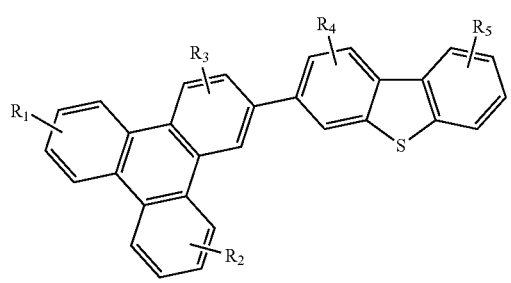
Compound 8'
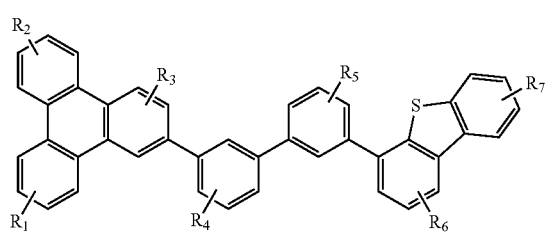
Compound 9'G
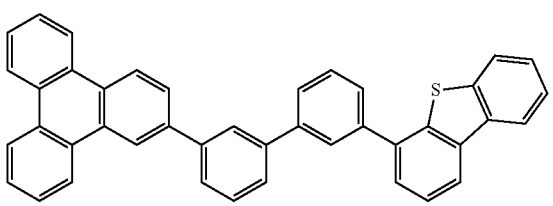
Compound 9'
Compound 10'G
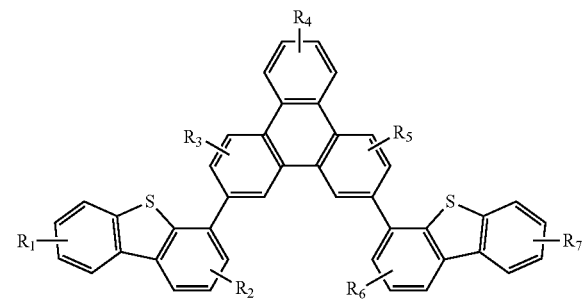
Compound 10'
Compound 15'G
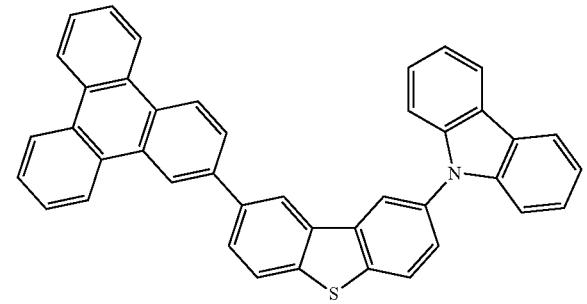
Compound 15'
where $R_1$ to $R_n$ represents, independently, mono, di, tri or tetra substitutions selected from alkyl, alkoxy, amino, alkenyl, alkynyl, aryalkyl, aryl and heteroaryl, or no substitution.
Examples of compounds having the structure of the formula (H-VI) include:

Compound 1G 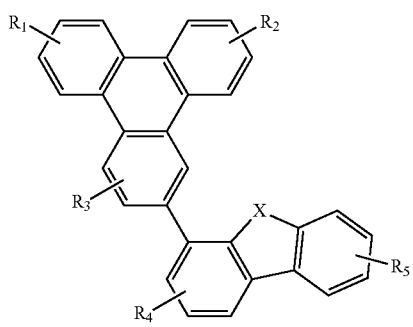 Compound 1 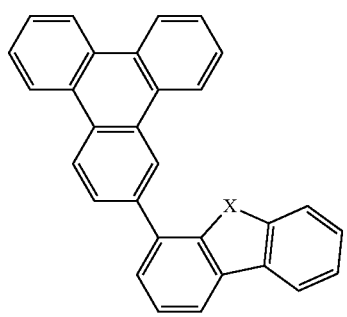
Compound 2G 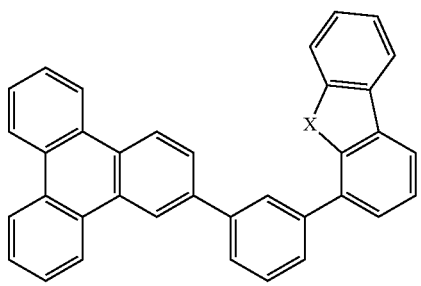 Compound 2
Compound 3G 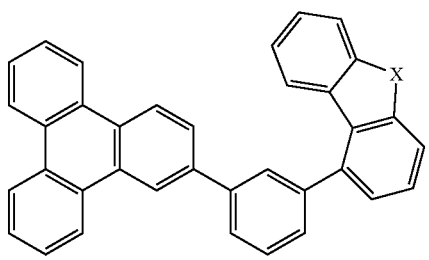 Compound 3
Compound 4G 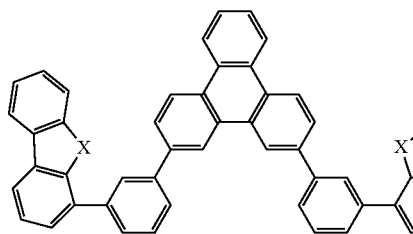 Compound 4 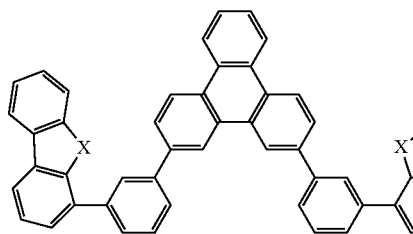
Compound 5G 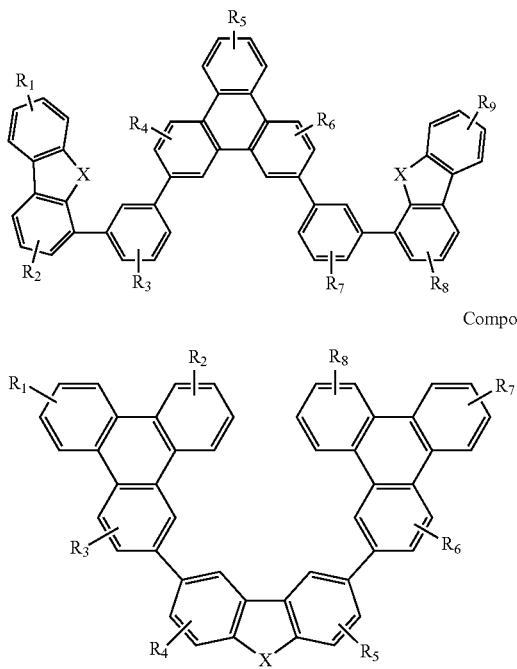 Compound 5 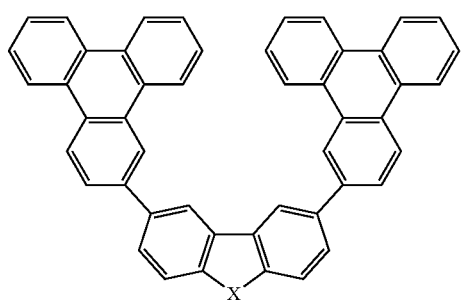

-continued
Compound 6G
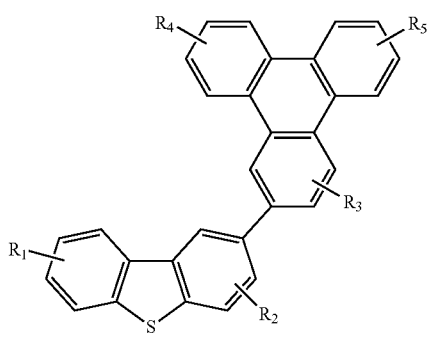
Compound 6
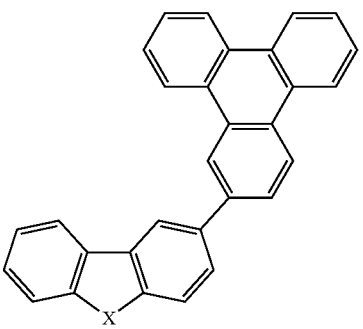
Compound 7G
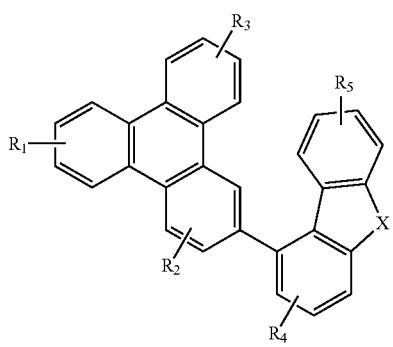
Compound 7
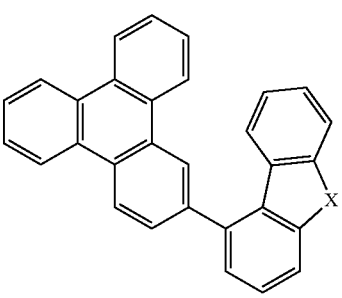
Compound 8G
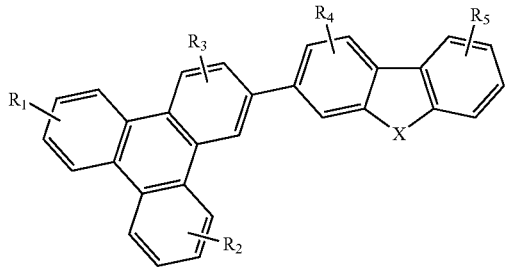
Compound 8
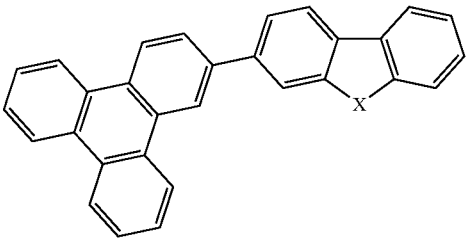
Compound 9G
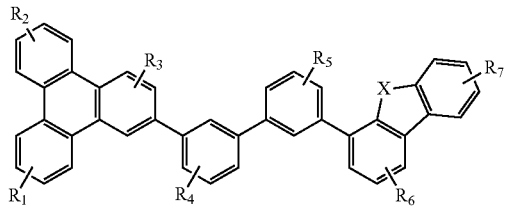
Compound 9
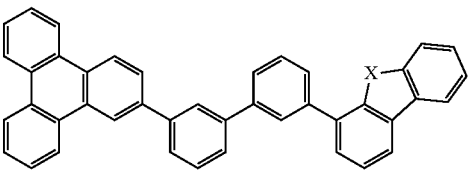
Compound 10G
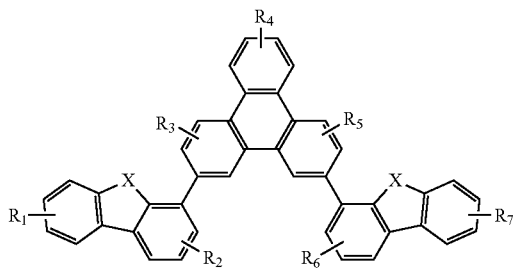
Compound 10
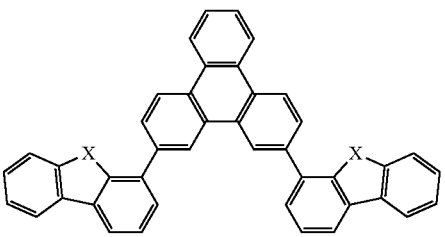

-continued
Compound 15G
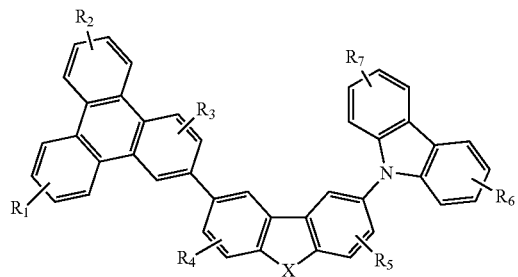
Compound 15
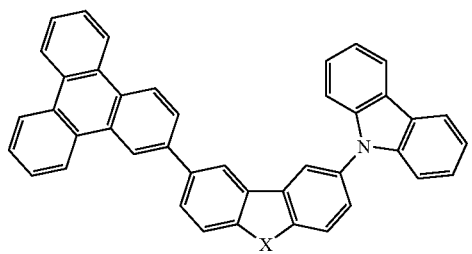
Compound 19 G
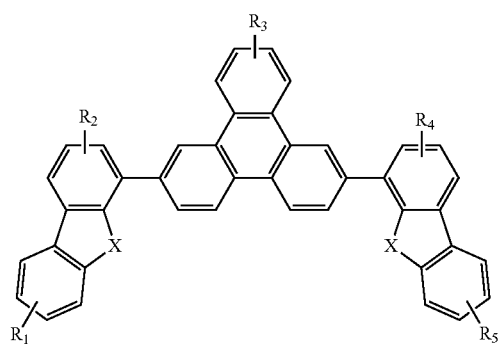
Compound 19
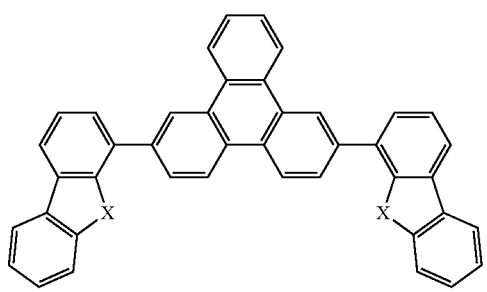
Compound 20 G
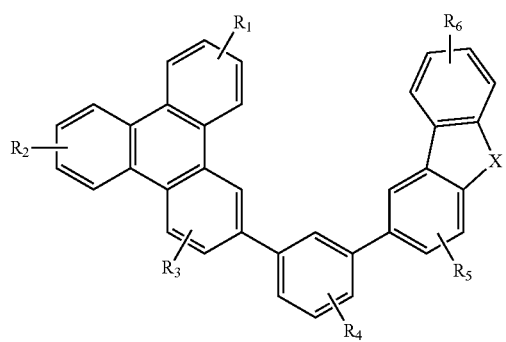
Compound 20
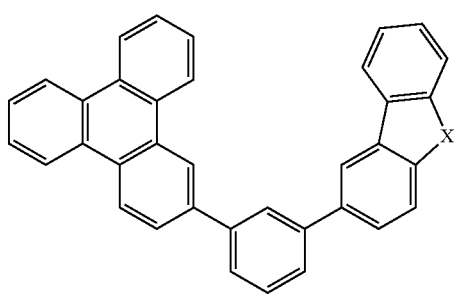
Compound 21 G
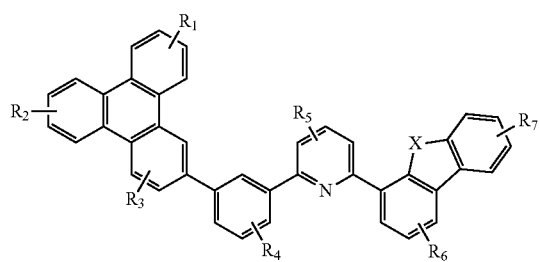
Compound 21
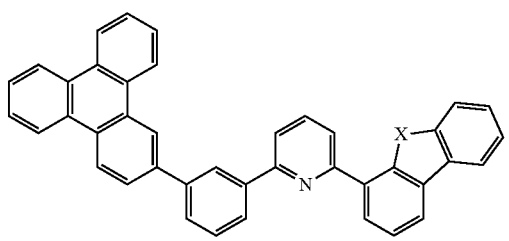

-continued
Compound 22 G
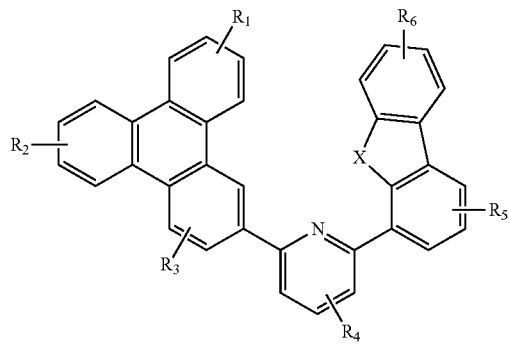
Compound 22
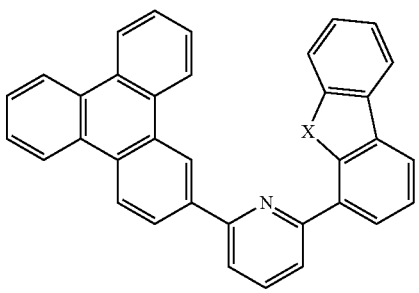
Compound 23 G
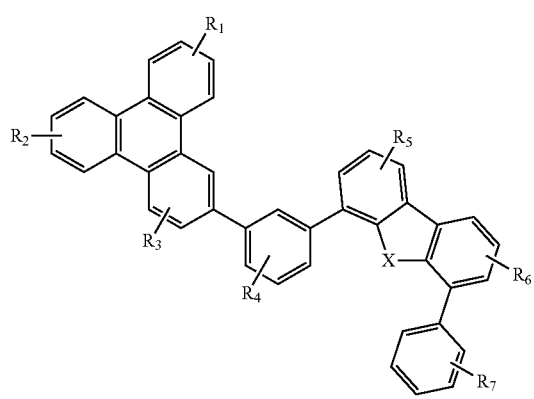
Compound 23
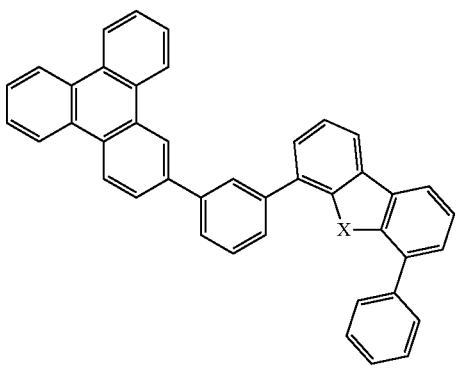
Compound 24 G
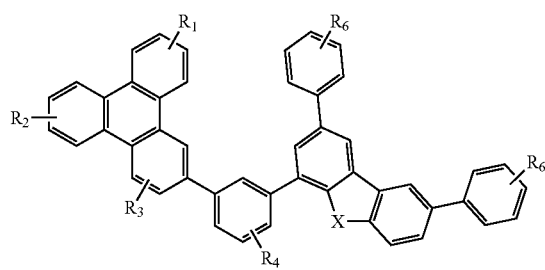
Compound 24
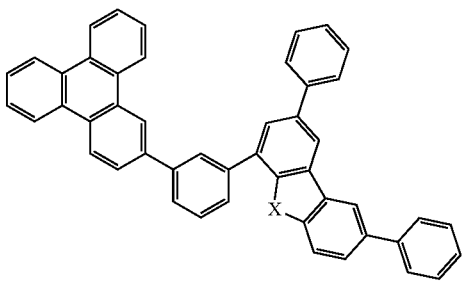
Compound 25 G
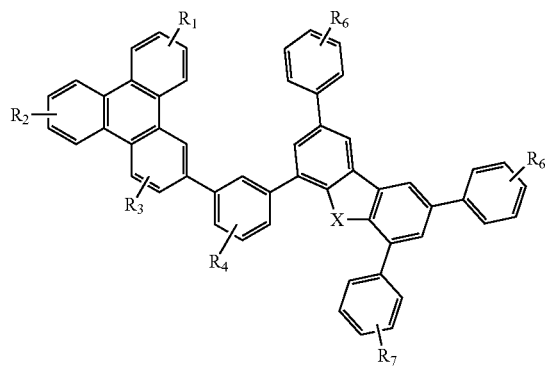
Compound 25
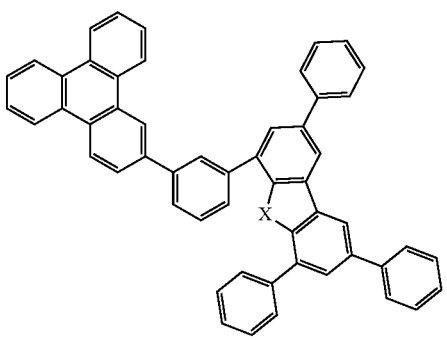

-continued
Compound 26 G
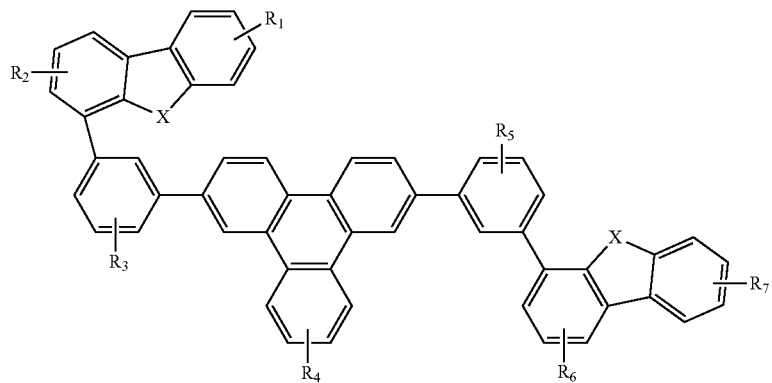
Compound 24 G
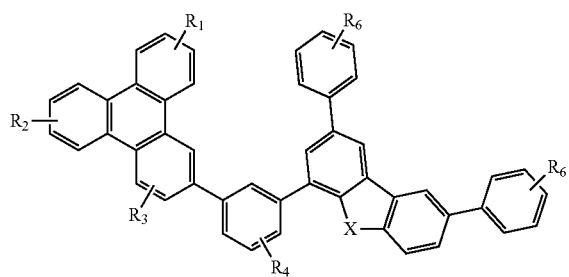
Compound 26
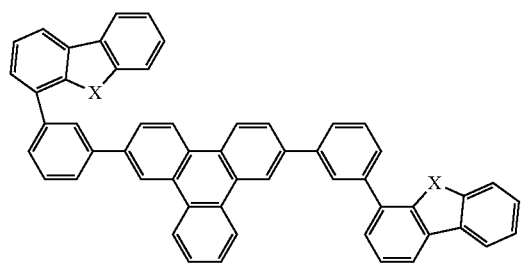
Compound 27 G
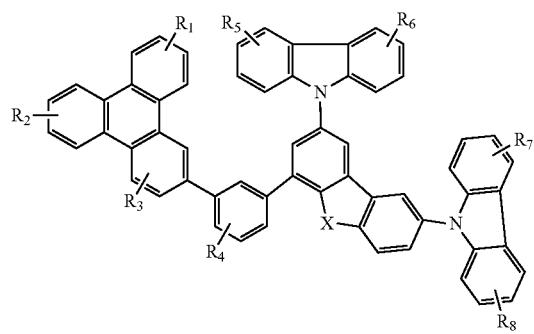
Compound 27
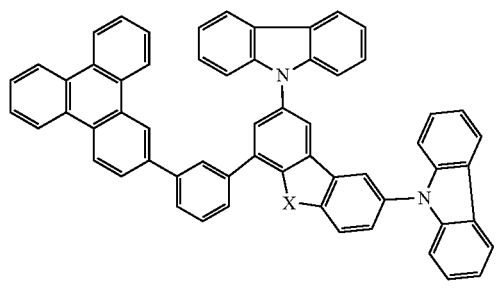
Compound 28 G
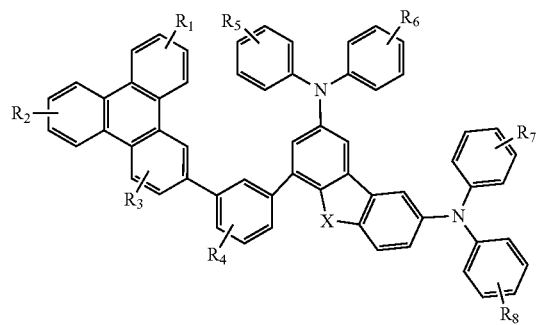

-continued
Compound 28
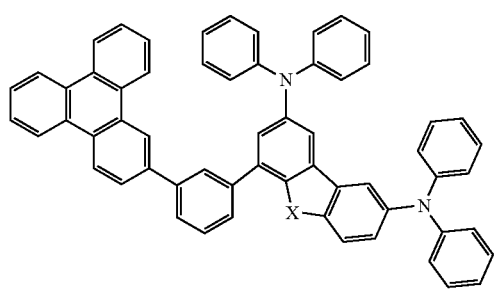
Compound 29
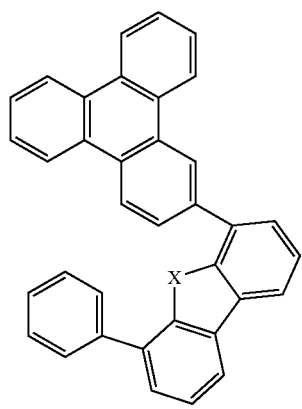
Compound 30
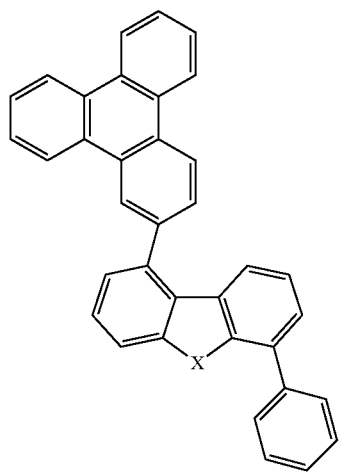
Compound 29 G
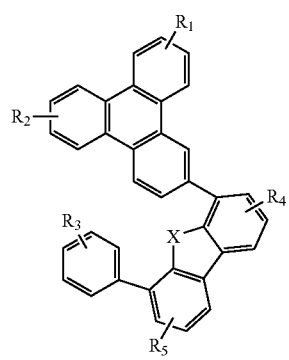
Compound 30 G
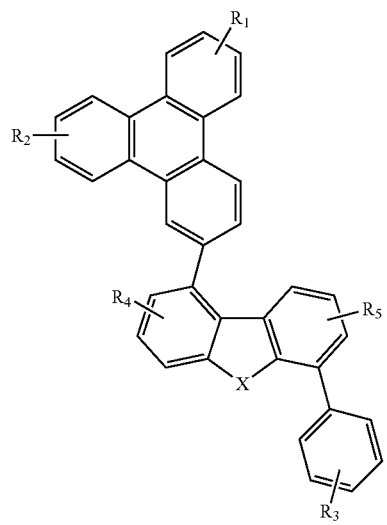
Compound 31 G
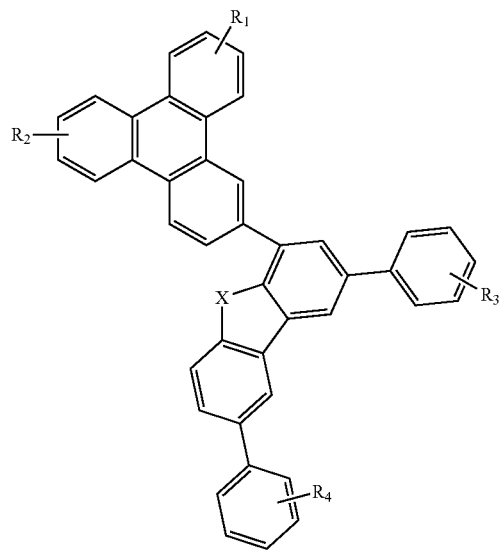

-continued
Compound 31
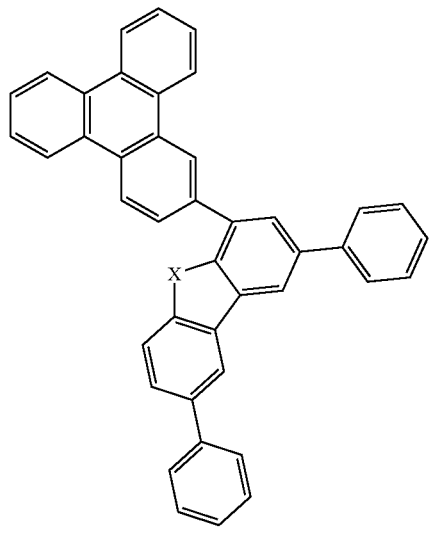
Compound 32 G
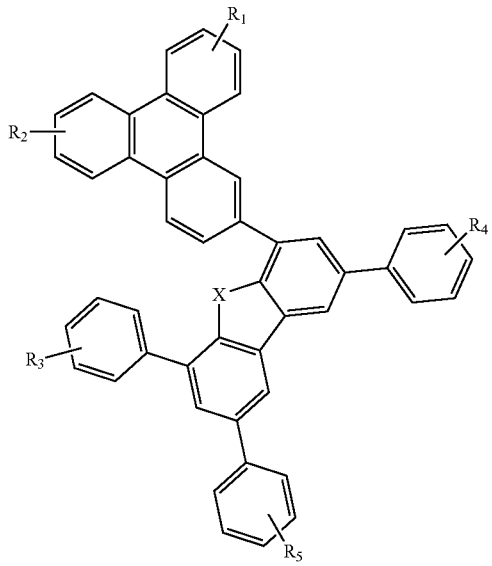
Compound 32
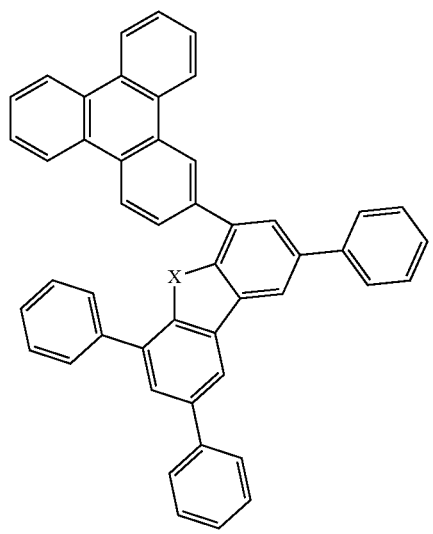
Compound 33 G
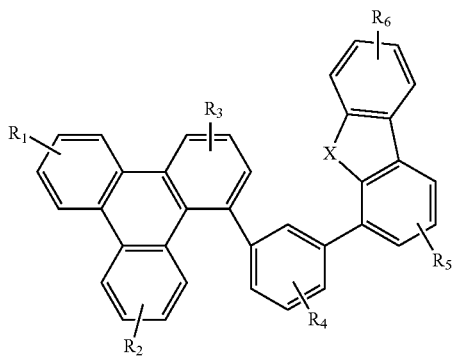
Compound 33
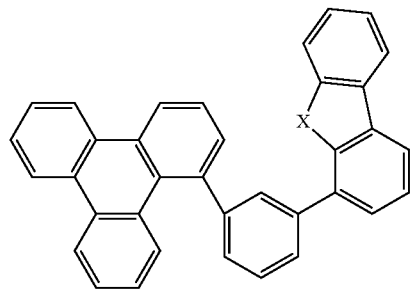
Compound 34 G
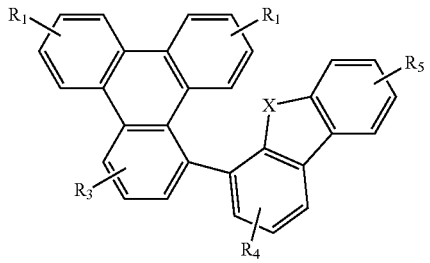

-continued
Compound 34
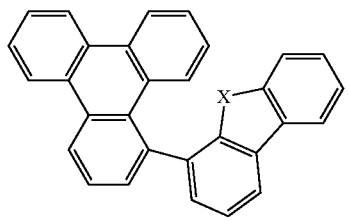
Compound 35 G
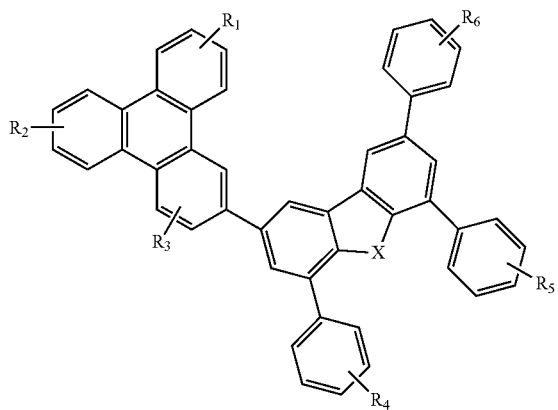
Compound 35
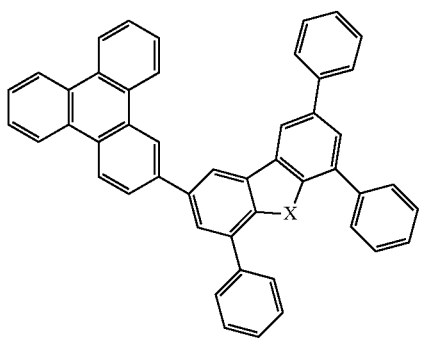
Compound 36 G
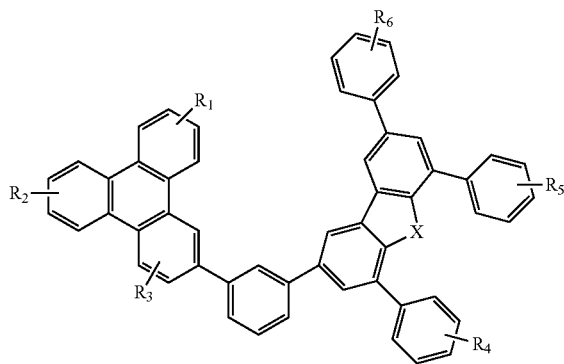
Compound 36
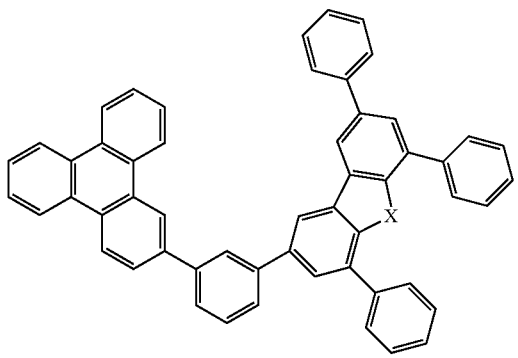
Compound 37 G
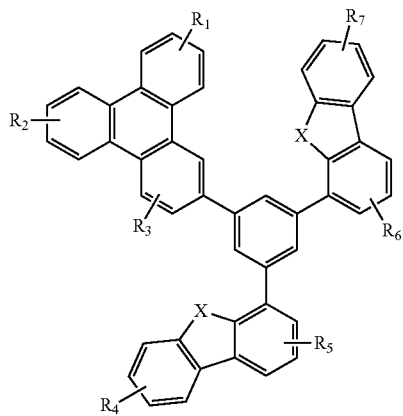

-continued
Compound 37
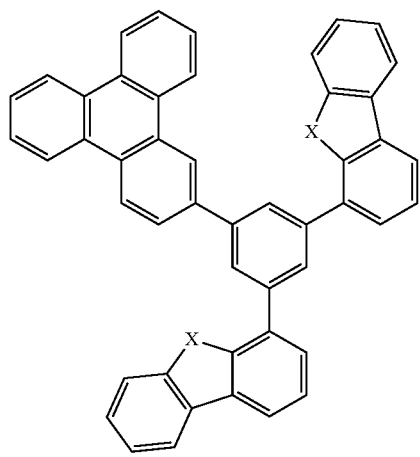
Compound 38 G
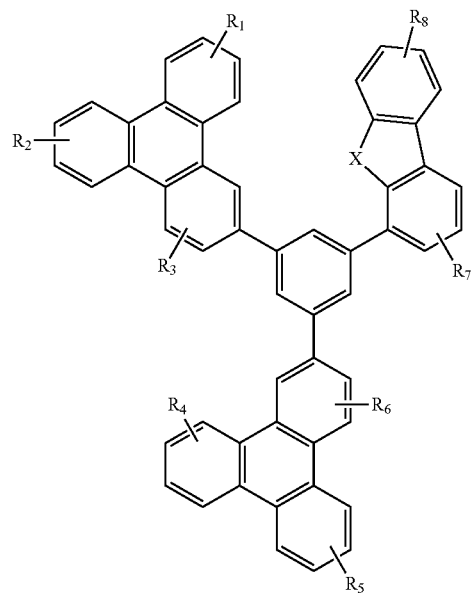
Compound 38
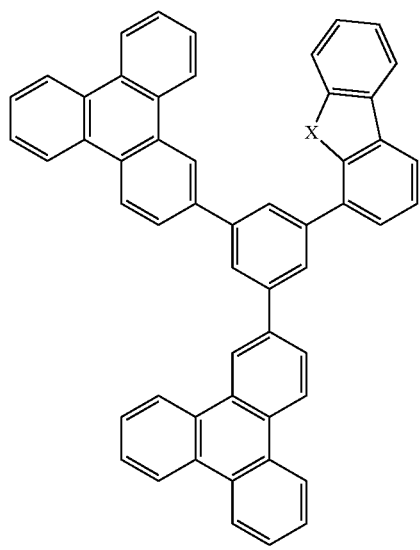
Compound 39 G
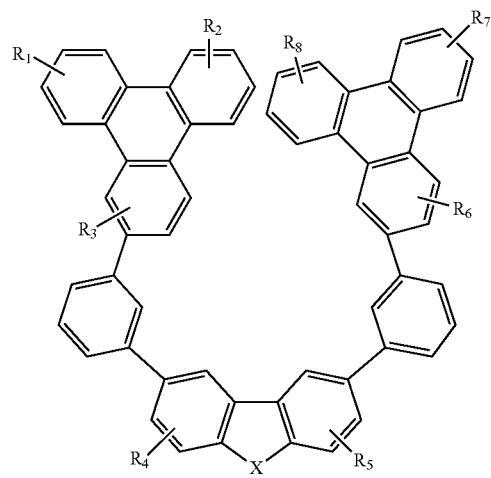
Compound 39
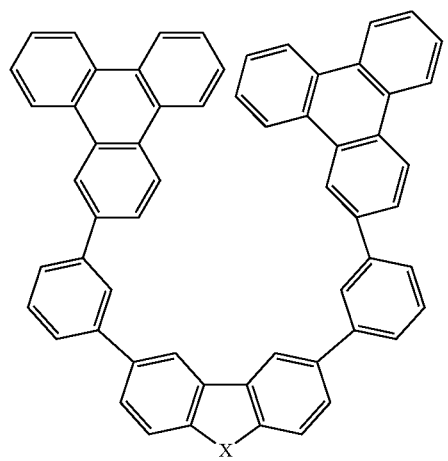
Compound 40 G
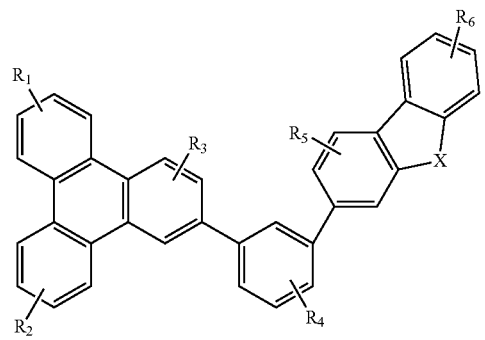

-continued
Compound 40
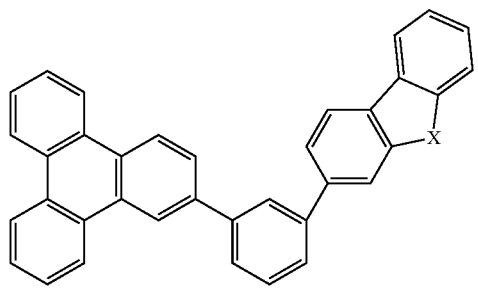
Compound 41 G
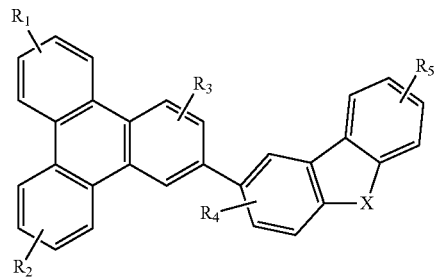
Compound 41
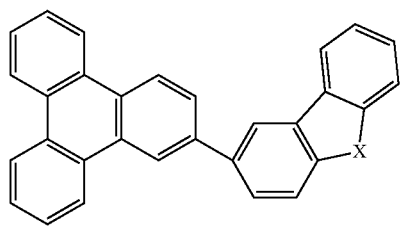
Compound 42 G
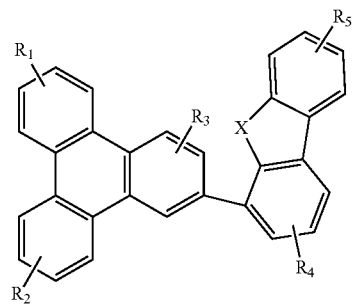
Compound 42
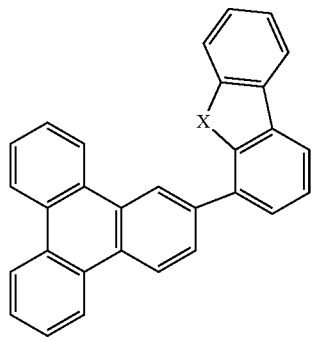
Compound 43 G
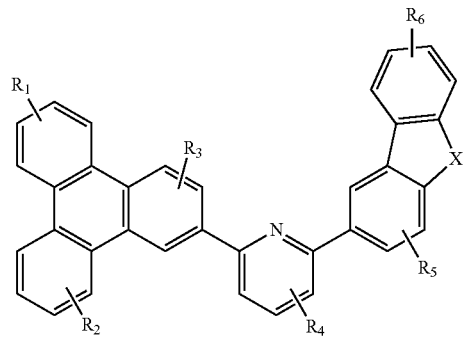
Compound 43
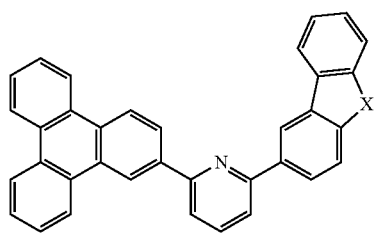
Compound 44 G
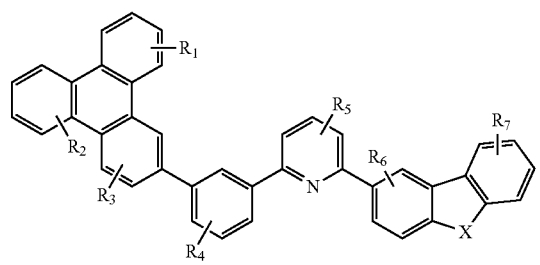

-continued
Compound 44
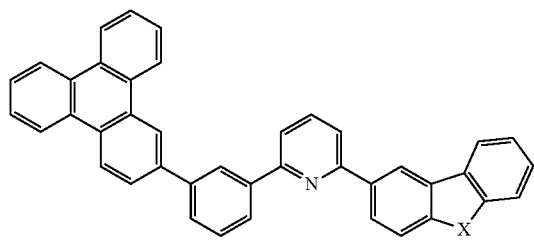
Compound 45 G
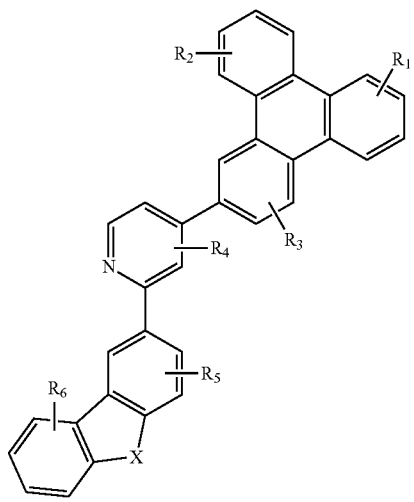
Compound 45
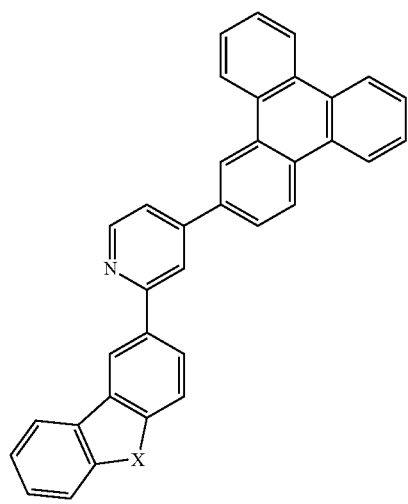
Compound 46 G
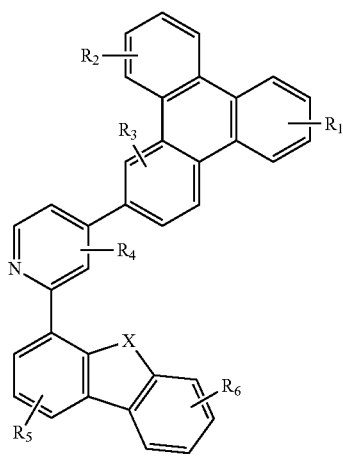
Compound 46
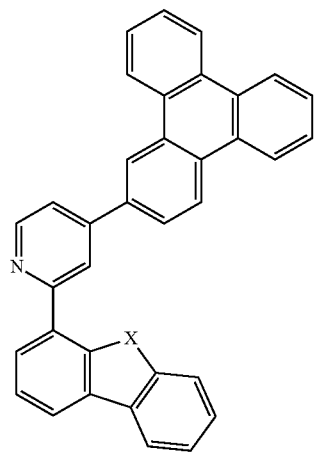
Compound 47 G
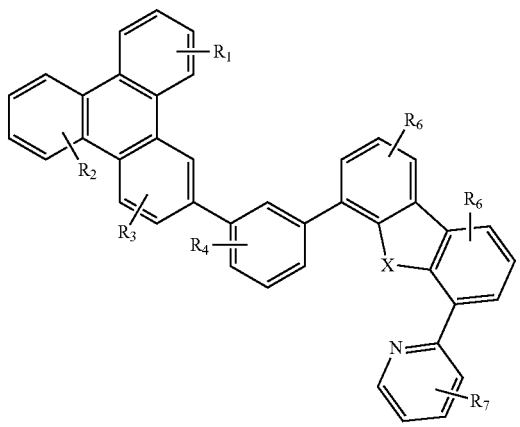

Compound 47

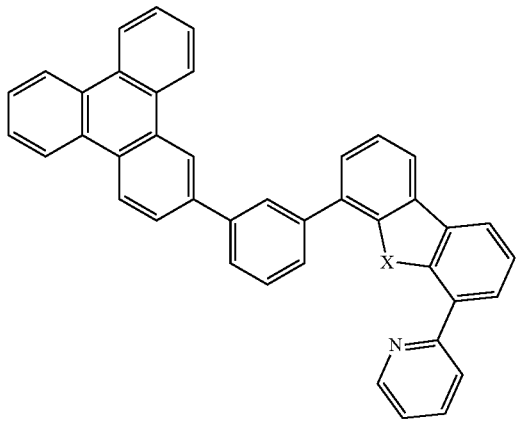

Compound 48 G

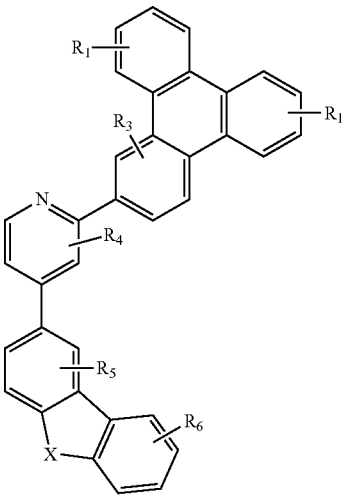

Compound 48

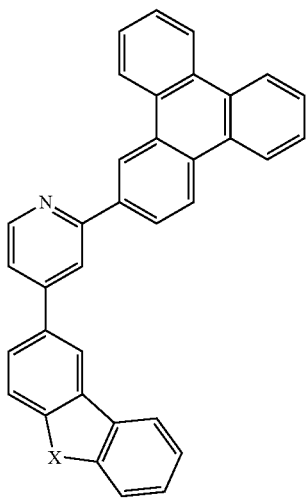

where X is S or O. Preferably, X is S. $R_1$ to $R_n$ are independently selected from the group consisting of $C_nH_{2n+1}$, $OC_nH_{2n+1}$, $OAr_1$, $N(C_nH_{2n+1})_2$, $N(Ar_1)(Ar_2)$, CH=CH—$C_nH_{2n+1}$, C=CH$C_nH_{2n+1}$, $Ar_1$, $Ar_1$—$Ar_2$, $C_nH_{2n}$-$A_{r1}$, or no substitution. Each of $R_1$ to $R_n$ may represent mono, di, tri, or tetra substitutions. n is 1, 2, 3, 4, 5, 6, 7, 8, 9, or 10. $Ar_1$ and $Ar_2$ are independently selected from the group consisting of benzene, biphenyl, naphthalene, triphenylene, carbazole, and heteroaromatic analogs thereof. At least one of $R_1$, $R_2$, and $R_3$ includes a triphenylene group.

The synthesis information for the host compounds described above can be found in PCT publication No. WO 2009/021126 published on 12 Feb. 2009 the contents of which are incorporated herein by reference.

Substrate:

The OLED of the present invention may be prepared on a substrate. The substrate referred to in this case is a substrate for supporting the OLED, and it is preferably a flat substrate in which light in the visible region of about 400 to about 700 nm has a transmittance of at least about 50%.

The substrate may include a glass plate, a polymer plate and the like. In particular, the glass plate may include soda lime glass, barium.strontium-containing glass, lead glass, aluminosilicate glass, borosilicate glass, barium borosilicate glass, quartz and the like. The polymer plate may include polycarbonate, acryl, polyethylene terephthalate, polyether sulfide, polysulfone and the like.

Electrodes:

The anode 3 in the OLED 100 of the present invention assumes the role of injecting holes into the hole injecting layer, the hole transporting layer or the light emitting layer. Typically the anode has a work function of 4.5 eV or more. Specific examples of a material suitable for use as the anode include indium tin oxide alloy (ITO), tin oxide (NESA), indium zinc oxide, gold, silver, platinum, copper and the like. The anode can be prepared by forming a thin film from electrode substances, such as those discussed above, by a method such as a vapor deposition method, a sputtering method and the like.

When light is emitted from the light emitting layer, the transmittance of light in the visible light region in the anode is preferably larger than 10%. The sheet resistance of the anode is preferably several hundred Ω/square or less. The film thickness of the anode is selected, depending on the material, and is typically in the range of from about 10 nm to about 1 μm, and preferably from about 10 nm to about 200 nm.

The cathode 11 comprises preferably a material having a small work function for the purpose of injecting an electron into the electron injecting layer, the electron transporting layer or the light emitting layer. Materials suitable for use as the cathode include, but are not limited to indium, aluminum, magnesium, magnesium-indium alloys, magnesium-aluminum alloys, aluminum-lithium alloys, aluminum-scandium-lithium alloys, magnesium-silver alloys and the like. For transparent or top-emitting devices, a TOLED cathode such as disclosed in U.S. Pat. No. 6,548,956 is preferred.

The cathode can be prepared, as is the case with the anode, by forming a thin film by a method such as a vapor deposition method, a sputtering method and the like. Further, an embodiment in which light emission is taken out from a cathode side can be employed as well.

Figure 2:
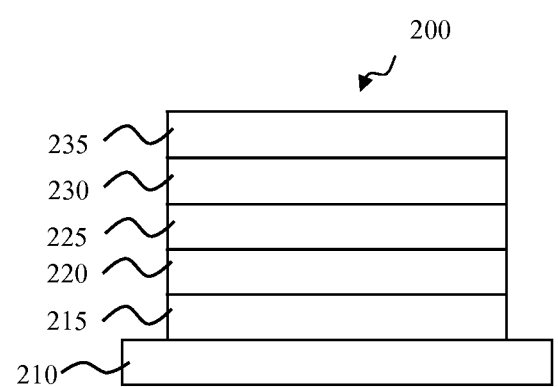
FIG. 2 shows an inverted OLED according to another embodiment of the present disclosure.

Inverted OLED:

FIG. 2 shows an inverted OLED 200 according to another embodiment of the present disclosure. The device includes a substrate 210, a cathode 215 an emitter layer 220, a first hole transport layer 225, a second hole transport layer 230, and an anode 235. Because the most common OLED configuration has a cathode disposed over the anode, and the OLED 200 has cathode 215 disposed under the anode 235, the OLED 200 may be referred to as an inverted OLED. The first hole transport layer 225 and the second hole transport layer 230 are formed of the first and second hole transport materials which are different from each other, as described above in connection with the OLED device embodiment 100.

The simple layered structures of OLED 100 and 200 are provided by way of non-limiting examples and it is understood that embodiments of the invention may be used in connection with a wide variety of other structures. Functional OLEDs may be achieved by combining the various layers described in different ways, or certain layers may be omitted entirely, based on the design, performance, and cost factors. Other layers not specifically described herein may also be included.

In one embodiment, the present invention comprises an OLED which comprises a host material, wherein the triplet energy of the host material is from about 2.0 eV to about 2.8 eV.

Examples

The invention will be described in further detail with reference to the following examples and comparative examples. However, the invention is not limited by the following examples.

An experimental green PHOLED Device #1 bearing the structure shown in FIG. 1 was constructed according to the present disclosure as follows. HAT-CN was used to form a 10 nm thick hole injection layer 4. Second hole transport material HTL2-I was used to form a 25 nm thick second hole transport layer 5. First hole transport material HTL1-1 was used to form a 5 nm thick first hole transport layer 6. Green phosphorescent emitter, a heteroleptic organo metallic compound identified below as GD-001, was the emitter dopant (11% doping level) used with the host material identified below as H-001 to form a 30 nm thick emitter layer 7. An undoped layer of the H-001 was used to form a 5 nm thick hole blocking layer 8. Alq$_3$ was used to form a 40 nm thick electron transport layer 9. LiF was used to form 1 nm thick electron injection layer 11. A 100 nm thick layer of Aluminum formed the cathode 11 and an 80 nm thick layer of ITO formed the anode 3. Table 2 shows the chemical structures of the organic materials used. The green phosphorescent emitter GD-001 is one of the heteroleptic organometallic compounds disclosed in WO2010/028151, specifically the Compound 12 disclosed in WO2010/028151, the disclosure of which is incorporated herein by reference in its entirety. The host material H-001 is one of the triphenylene-containing benzo-fused thiopehene compounds disclosed herein, specifically the Compound 2' among the compounds having the general structure H-III.

TABLE 2

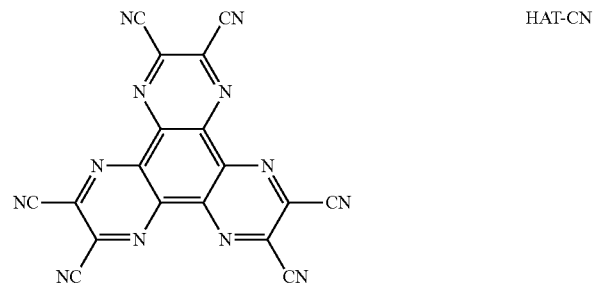

TABLE 2-continued
| | |
|---|---|
| 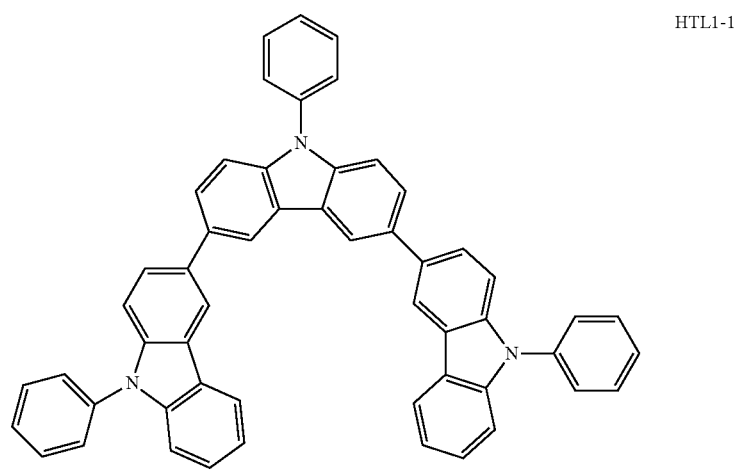 | HTL1-1 |
| 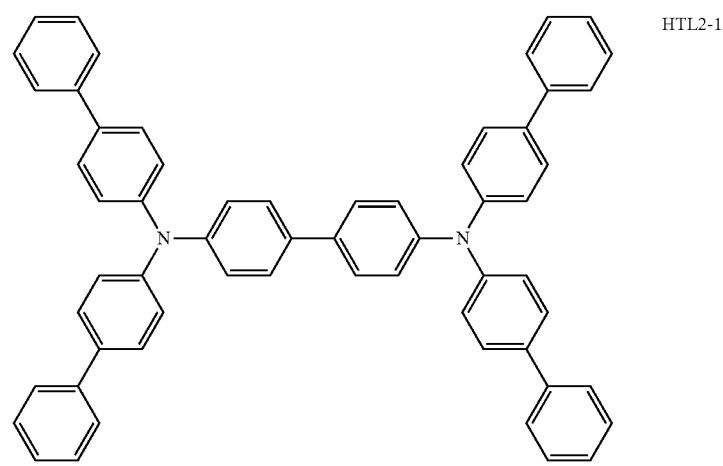 | HTL2-1 |
| 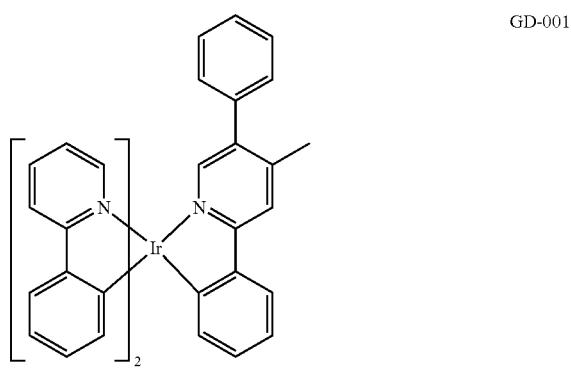 | GD-001 |
| 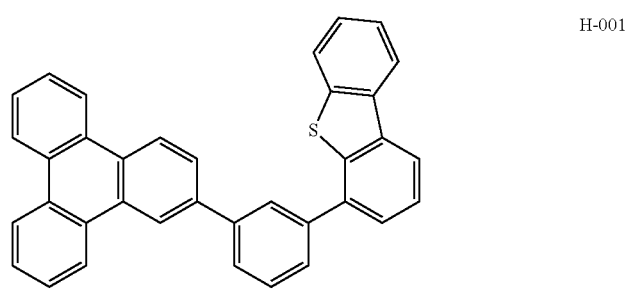 | H-001 |

TABLE 2-continued $$\left[ \begin{array}{c} \text{quinolinolato-Al structure} \end{array} \right]_3 \quad Alq_3$$

All organic layers were deposited under high-vacuum conditions ($1\times10^{-7}$ Torr). The green PHOLED was transferred directly from vacuum into an inert environment glove-box, where it was encapsulated using a UV-curable epoxy, and a glass lid with a moisture getter. The PHOLED emission profiles were assumed to be Lambertian, so EQE was calculated from measurements, made with a SpectraScan PR705, of the emission intensity normal to the substrate. The current and voltage measurements were obtained using a Keithley 236 source measure unit.

For performance comparison, Comparative Example PHOLED Device #2 was also constructed. PHOLED Device #2 also was built with two hole transport layers but both layers were built with a single material (the second hole transport material, HTL2-1) resulting in a 30 nm thick layer of HTL2-1. In effect, Device #2 is equivalent to a conventional single hole transport layer configuration. Table 3a shows the performance comparison of the two green PHOLED devices. Device #1 is the PHOLED device built according to the present disclosure and Device #2 is the conventional single hole transport layer device. Table 3b shows a summary of the two devices' construction in terms of the materials used for the hole transporting layers and the emitter layer.

TABLE 3a

| Device # | 1931 CIE x | y | Voltage (V) | LE (cd/A) | EQE (%) | At 40 mA/cm² $L_0$ (nits) | $LT_{80\%}$ (hrs) |
|---|---|---|---|---|---|---|---|
| 1 | 0.320 | 0.628 | 5.5 | 71 | 20 | 21612 | 365 |
| 2 | 0.319 | 0.629 | 5.4 | 66 | 18 | 19204 | 266 |

TABLE 3b

| Device # | Hole Transporting Material 2 | Hole Transporting Material 1 | Emitter Dopant | Emitter Host |
|---|---|---|---|---|
| 1 | arylamine type compound HTL2-I | carbazole type compound HTL1-1 | heteroleptic organometallic compound GD-001 | triphenylene containing benzo-fused thiophene compound H-001 |
| 2 | arylamine type compound HTL2-I | None | heteroleptic organometallic compound GD-001 | triphenylene containing benzo-fused thiophene compound H-001 |

As shown in Table 3a, Device #1 exhibited unexpectedly substantially higher luminous efficiency (LE) and external quantum efficiency (EQE) over Device #2. The LE of Device #1 was 71 cd/A at 1,000 nits compared to 66 cd/A for Device #2. The EQE of Device #1 was 20% at 1,000 nits compared to 18% for Device #2. The substantially superior performance data of Device #1 was unexpected. Particularly, considering that in Device #2, three of the four listed materials are the same as those of Device #1, the degree of performance superiority demonstrated by Device #1 was unexpected.

Additionally, Device #1 also demonstrated an unexpectedly longer LT80 (the time for the luminance to decrease to 80% of its initial level) at 25° C. than Device #2. For LT80 measurements, the devices were operated at a constant current of 40 mA/cm², at 25° C. The LT80 of Device #1 was 365 hrs compared to 266 hours for the Device #2.

The device performance data for the prior art devices of WO2011/048821 shown above indicates that the enhanced device lifetimes observed with Device #1 would not be possible for the prior art devices in which the carbazole type compounds are provided in a layer between an emissive layer and a TPD hole transport layer in which the emissive layer's emitter dopant is a homoleptic emitter (Ir(ppy)₃) rather than the heteroleptic emitters used in Device #1.

The substantial improvement in the overall performance observed with Device #1 compared to Device #2 was unexpected, especially when considering the incremental difference in the structure of the devices (i.e. the addition of a thin layer (5 nm) of the compound HTL1-1. Without being bound by a theory, the inventors believe that the enhanced device performance is attributed to the combination of HTL1-1 and HTL2-1 in particular when used with the materials in the emitter layers disclosed herein. For example, in Device #1, The HTL1-1 compound used as a first hole transport layer positioned adjacent to the emitter layer is a polycarbazole type compound whose triplet energy is higher than second hole transport layer material HTL2-I which is a biphenyl arylamine type compound. The provision of a higher triplet energy material next to the emitter layer may reduce quenching of triplet excitons generated in the emitter layer. Additionally, because the HOMO energy of first hole transport layer material HTL1-1 in Device #1 is between that of second hole transport layer material HTL2-I and emitter layer host material H-001, the inventors believe that the HTL1-1 layer assists hole injection from the second hole transporting layer into the emitter layer. Still further, the HTL1-1 layer may also provide an electron blocking function in Device #1 since the LUMO energy of HTL1-1 is higher than that of HTL2-I. With the above three points, the triplet excitons can be well confined in the emitter layer with an overall better charge balance in the whole device.

Additionally, the performance data for the Device #1 was compared against the prior art devices disclosed in PCT International Application Publication No. WO2011/048821 A1. Table 3 shows comparative performance data of Example devices 6, 7

Unless otherwise specified, any of the layers of the various embodiments of the invention described herein may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

What is claimed is:

1. An organic light emitting device comprising an anode, a cathode and a plurality of organic layers sandwiched between them, the plurality of organic layers comprising:
   an emitter layer comprising a host material and a phosphorescent emitter material, the phosphorescent emitter material comprising a phosphorescent organometallic compound that emits phosphorescent radiation from a triplet molecular excited state when a voltage is applied across the first organic layer;
   a first hole transport layer disposed between the emitter layer and the anode, the first hole transport layer comprising a first hole transport material represented by the following general formula (HTL1)

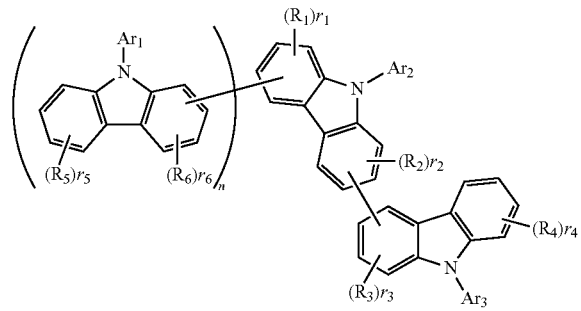

(HTL1)

wherein $R_1$, $R_2$, $R_3$, $R_4$, $R_5$, and $R_6$ may be the same or different fluoric atom, chlorine atom, a deuterium atom, a cyano group, a trifluoromethyl group, a nitro group, linear or branched alkyl group (C1-C6), cyclo-alkyl group (C5-C10), linear or branched alkoxy group (C1-C6), cyclo-alkoxy group (C5~C10), substituted or unsubstituted aromatic hydrocarbon group, substituted or unsubstituted aromatic heterocyclic group, substituted or unsubstituted condensed polycyclic aromatic group,
   $r_1$, $r_4$, $r_5$=0, 1, 2, 3, or 4,
   $r_2$, $r_3$, $r_6$; =0, 1, 2 or 3,
   n=0 or 1, and
$Ar_1$, $Ar_2$, and $Ar_3$ may be the same or different, substituted or unsubstituted aromatic hydrocarbon group, substituted or unsubstituted aromatic heterocyclic group, substituted or unsubstituted condensed polycyclic aromatic group, deuterium substituted aromatic hydrocarbon group, deuterium substituted aromatic heterocyclic group, or deuterium substituted condensed polycyclic aromatic group; and
a second hole transport layer disposed between the first hole transport layer and the anode whereby the first hole transport layer is next to the emitter layer between the emitter layer and the second hole transport layer, wherein the second hole transport layer comprising a second hole transport material that is different from the first hole transport material;
wherein the first hole transport material has a triplet energy that is higher than that of the second hole transport material; and
wherein the phosphorescent organometallic compound is a heteroleptic compound represented by the formula $L_2MX$, $LL'MX$, $LL'L''M$, or $LMXX'$, wherein L, L', L'', X, and X' are inequivalent, bidentate ligands and M is a metal that forms octahedral complexes, wherein L, L', and L'' are monoanionic inequivalent bidentate ligands coordinated to M through an $sp^2$ hybridized carbon and a heteroatom.

2. The organic light emitting device according to claim 1 wherein the phosphorescent organometallic compound is selected from the group consisting of phosphorescent organometallic platinum compounds, organometallic iridium compounds and organometallic osmium compounds.

3. The organic light emitting device according to claim 2 wherein the phosphorescent organometallic platinum compound has an aromatic ligand.

4. The organic light emitting device according to claim 2 wherein the phosphorescent organometallic iridium compound has an aromatic ligand.

5. The organic light emitting device according to claim 2 wherein the phosphorescent organometallic osmium compound has an aromatic ligand.

6. The organic light emitting device according to claim 1 wherein the second hole transport material comprises a second hole transport material comprising at least one of the compounds having a formula selected from the following formulae (HTL2-I) to (HTL2-VI):

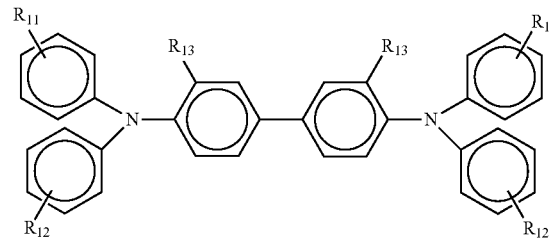

(HTL2-I)

wherein $R_{11}$ and $R_{12}$ may be the same or different and are independently selected from the group consisting of a hydrogen atom, a deuterium atom, a lower alkyl group, a lower alkoxy group, a phenyl group, a phenyl group having a lower alkyl group or deuterium substituent, and a phenyl group having a deuterium atom or a lower alkoxy group substituent with the proviso at least one of $R_{11}$ and $R_{12}$ is a deuterium atom, a normal butyl group, an isobutyl group, a secondary butyl group, a tertiary butyl group, a phenyl group, a phenyl group having a lower alkyl group substituent, or a phenyl group having a lower alkoxy group substituent; and $R_{13}$ represents a hydrogen atom, a deuterium atom, a lower alkyl group, a lower alkoxy group or a chlorine atom;

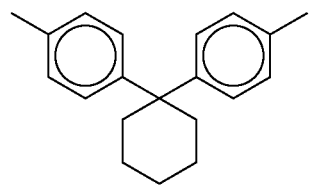

(d1)

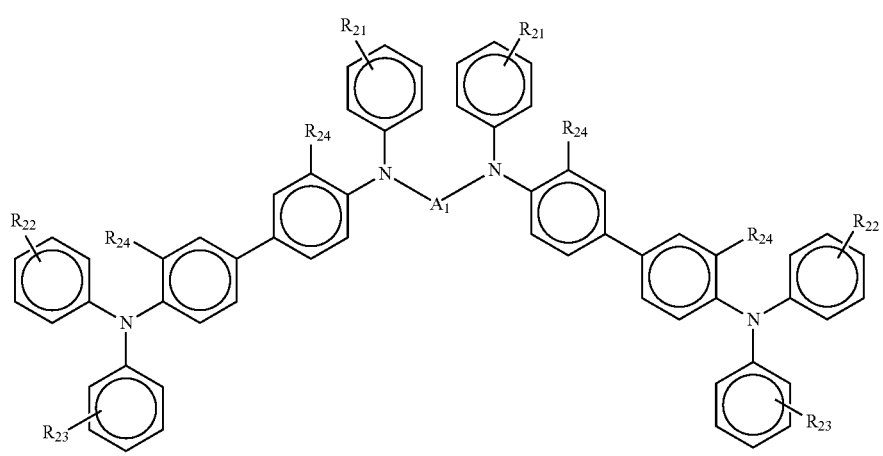

(HTL2-II)

wherein $R_{21}$, $R_{22}$ and $R_{23}$ may be the same or different and each represents a hydrogen atom, a deuterium atom, a lower alkyl group, a lower alkoxy group, an unsubstituted phenyl group, or a phenyl group having a lower alkyl group or a lower alkoxy group as a substituent(s);

$R_{24}$ represents a hydrogen atom, a deuterium atom, a lower alkyl group, a lower alkoxy group or a chlorine atom; and $A_1$ represents a group represented by any one of the following structural formulae (a1) to (i1);

-continued

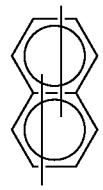

(e1)

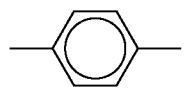

(a1)

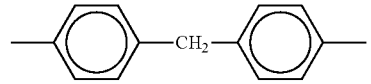

(f1)

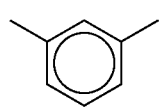

(b1)

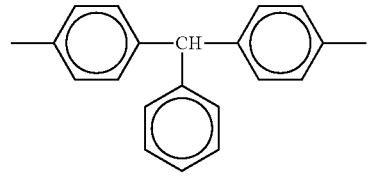

(g1)

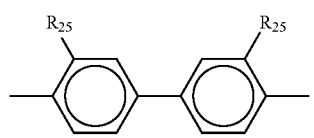

(c1)

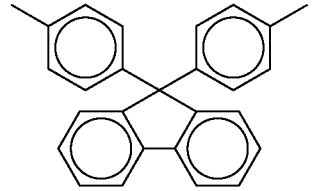

(h1)

(i1)

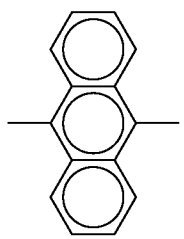

in which R$_{25}$ represents a hydrogen atom, a deuterium atom, a lower alkyl group, a lower alkoxy group or a chlorine atom;

(HTL2-III)

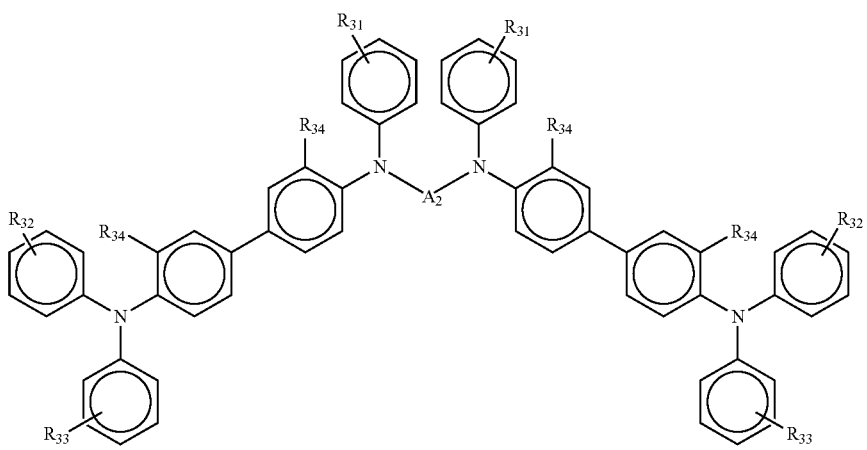

wherein R$_{31}$, R$_{32}$ and R$_{33}$ may be the same or different and each represents a hydrogen atom, a deuterium atom, a lower alkyl group, a lower alkoxy group, an unsubstituted phenyl group, or a phenyl group having a deuterium atom, a lower alkyl group or a lower alkoxy group as a substituent(s);

R$_{34}$ represents a hydrogen atom, a deuterium atom, a lower alkyl group, a lower alkoxy group or a chlorine atom; and A$_2$ represents a group represented by any one of the following formulae (j1) to (n1)

(j1)

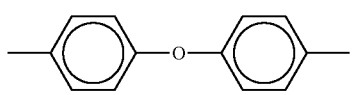

(k1)

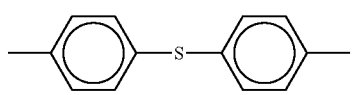

(l1)

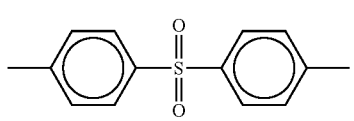

(m1)

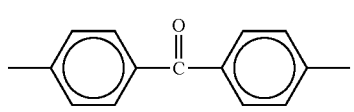

(n1)

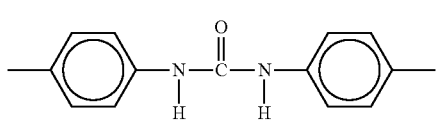

(HTL2-IV)

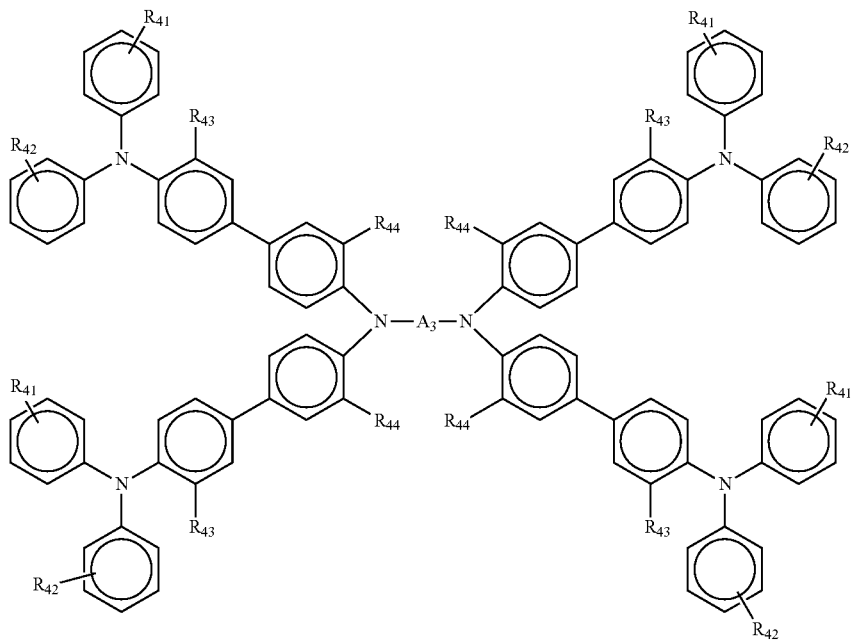

wherein $R_{41}$ and $R_{42}$ may be the same or different and each represents a hydrogen atom, a deuterium atom, a lower alkyl group, a lower alkoxy group, an unsubstituted phenyl group or a phenyl group having a deuterium atom, a lower alkyl group or a lower alkoxy group as a substituent(s);

$R_{43}$ represents a hydrogen atom, a lower alkyl group, a lower alkoxy group or a chlorine atom; and $A_3$ represents a group represented by anyone of the following structural formulae (a2) to (i2)

(a2)

(b2)

(c2)

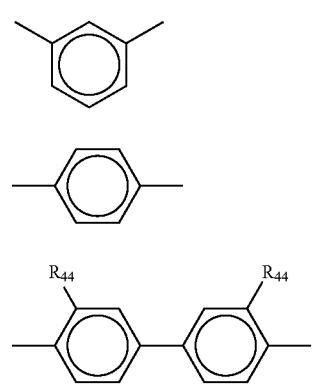

(d2)

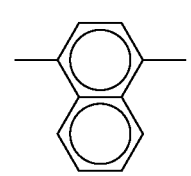

(e2)

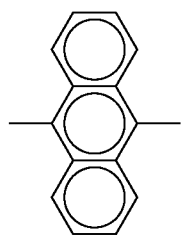

(f2)

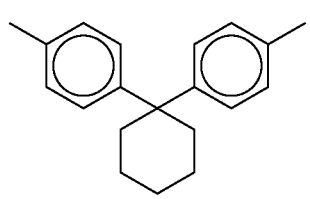

(g2)

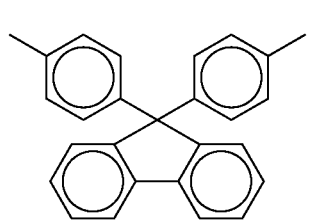

(h2)

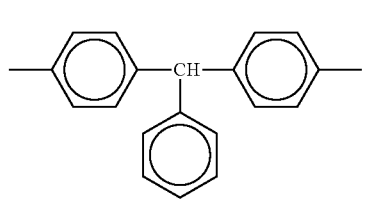

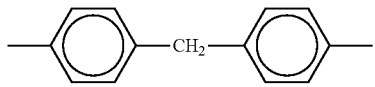

(i2)

in which $R_{44}$ represents a hydrogen atom, a deuterium atom, a lower alkyl group, a lower alkoxy group or a chlorine atom;

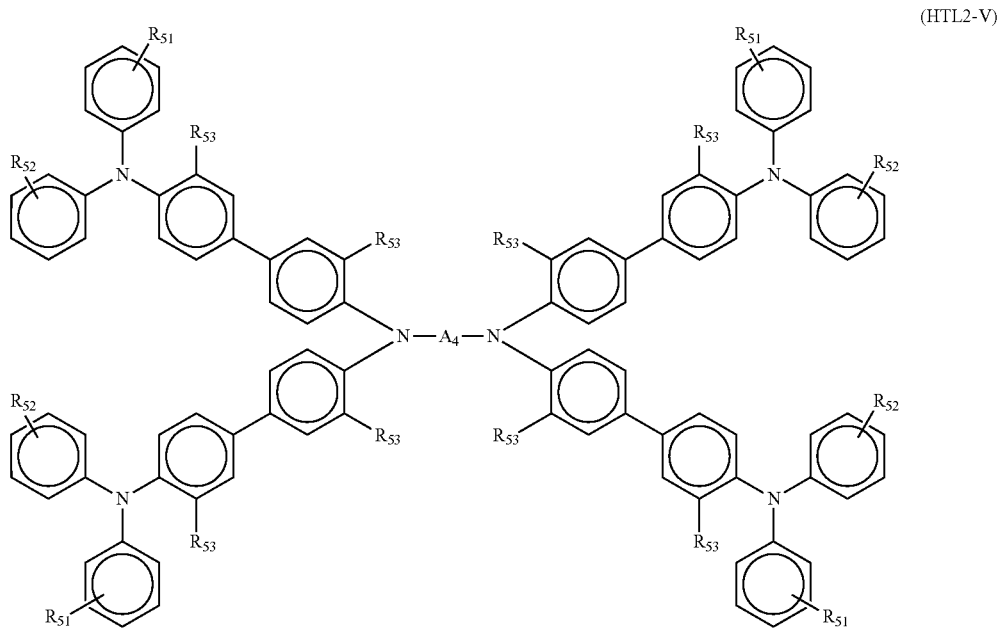

(HTL2-V)

wherein $R_{51}$ and $R_{52}$ may be the same or different and each represent a hydrogen atom, a deuterium atom, a lower alkyl group, a lower alkoxy group, an unsubstituted phenyl group or a phenyl group having a deuterium atom, a lower alkyl group or a lower alkoxy group as a substituent(s);

$R_{53}$ represents a hydrogen atom, a deuterium atom, a lower alkyl group, a lower alkoxy group or a chlorine atom; and $A_4$ represents a group represented by anyone of the following structural formulae (j2) to (n2)

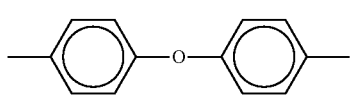

(j2)

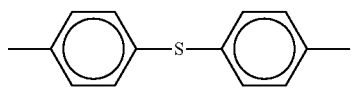

(k2)

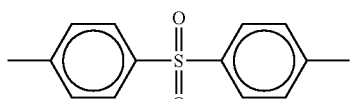

(l2)

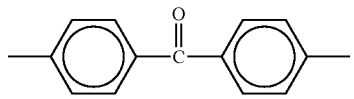

(m2)

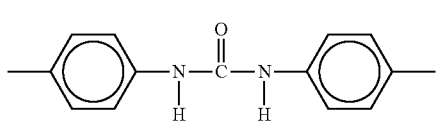

(n2)

(HTL2-VI)

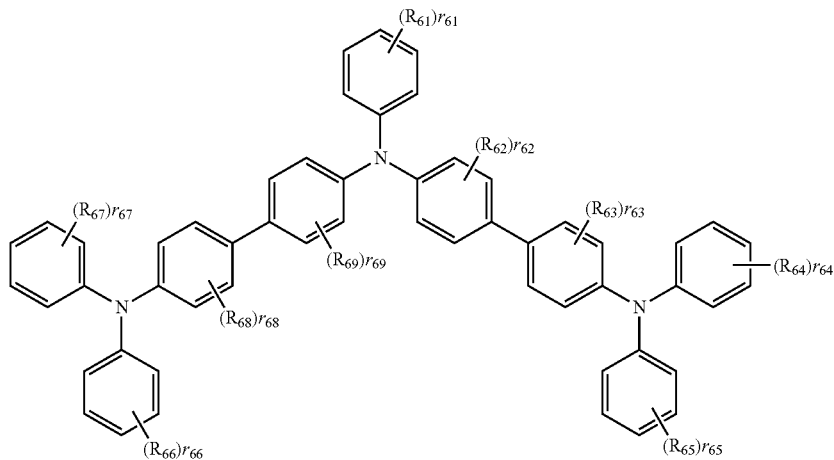

where $R_{61}$ to $R_{69}$, which may be the same or different, represent a hydrogen atom, a deuterium atom, a lower alkyl group, a lower alkoxy group, an unsubstituted aromatic hydrocarbon group, a phenyl group having a deuterium atom, a lower alkyl group or a lower alkoxy group; $r_{61}$ to $r_{69}$, which may be the same or different, represent 0, 1 or 2.

7. The organic light emitting device of claim 1, wherein the first hole transport material is selected from the group consisting of:

Compound HTL1-1

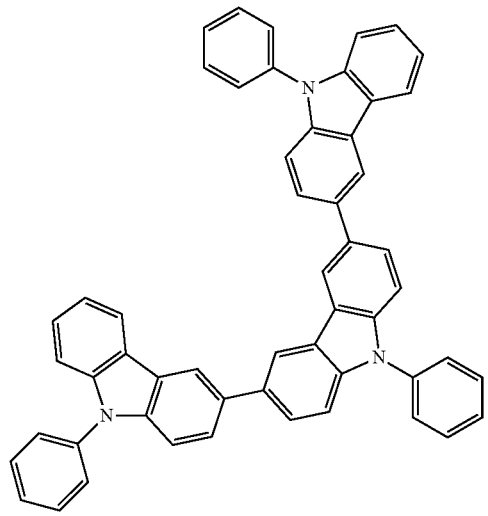

Compound HTL1-2

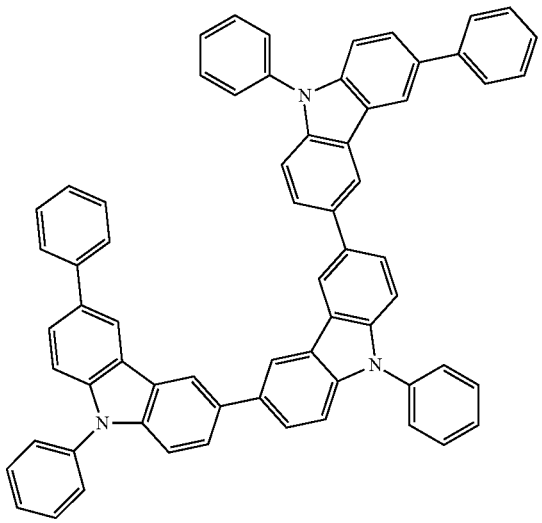

Compound HTL1-3
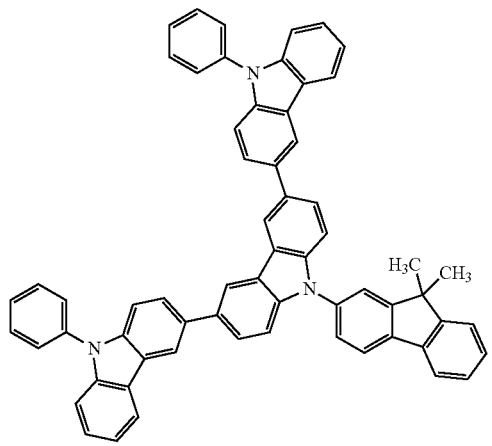
Compound HTL1-4
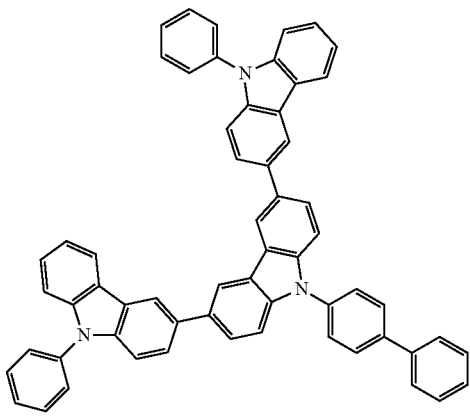
Compound HTL1-5
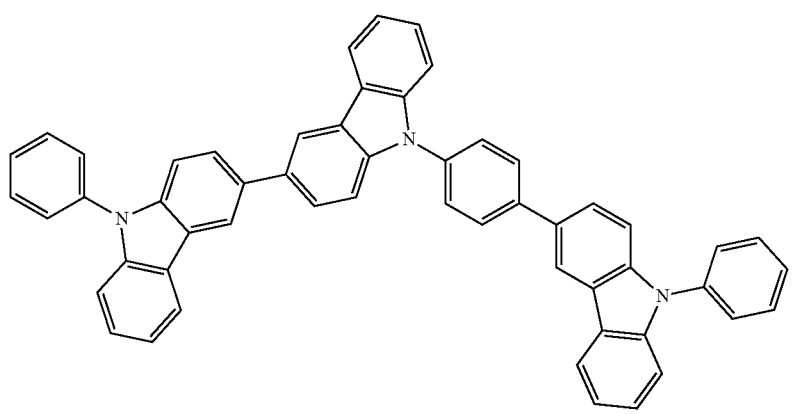
Compound HTL1-6
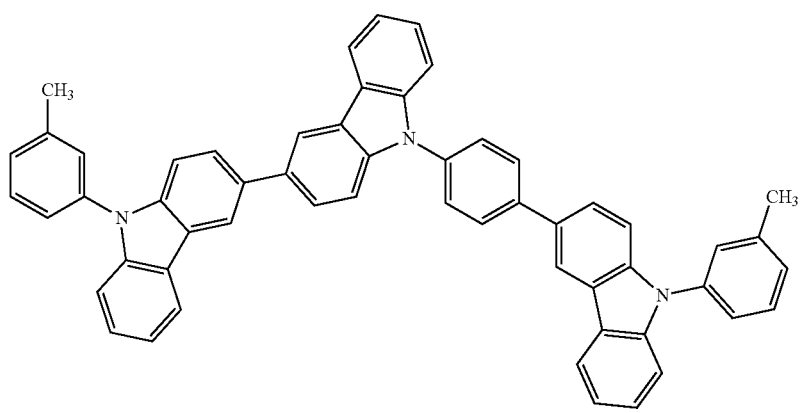

Compound HTL1-7
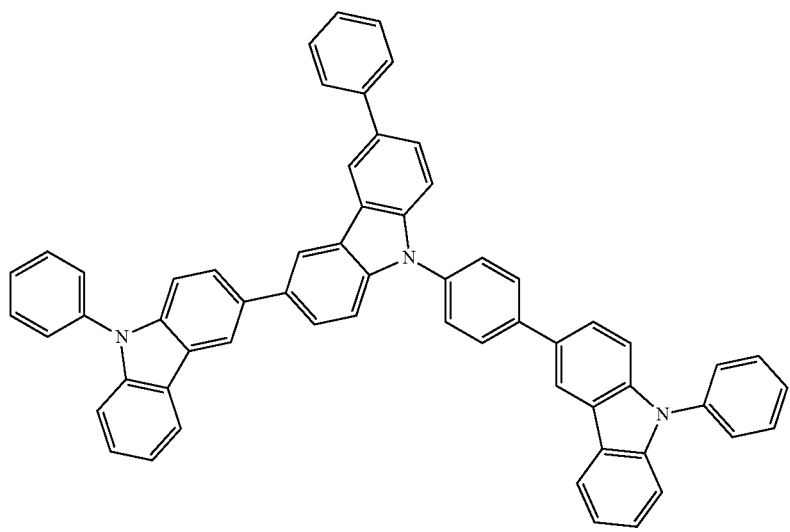
Compound HTL1-8
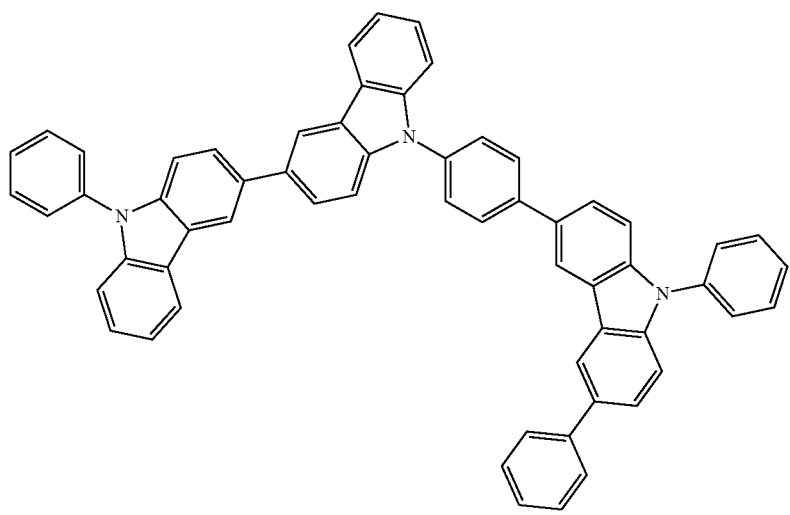
Compound HTL1-9
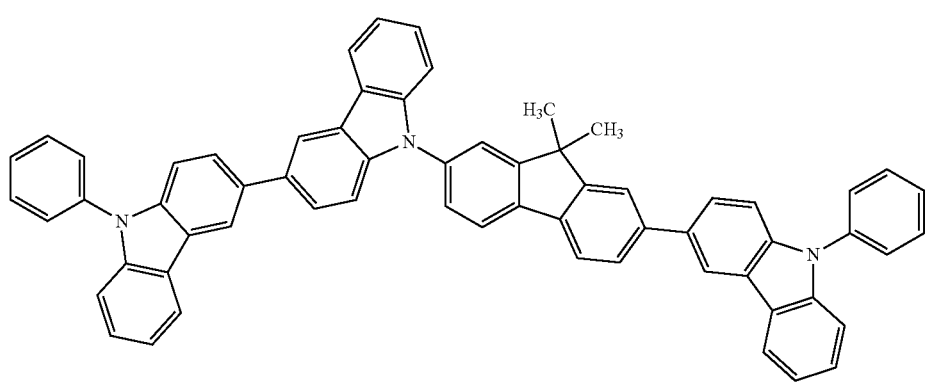

-continued
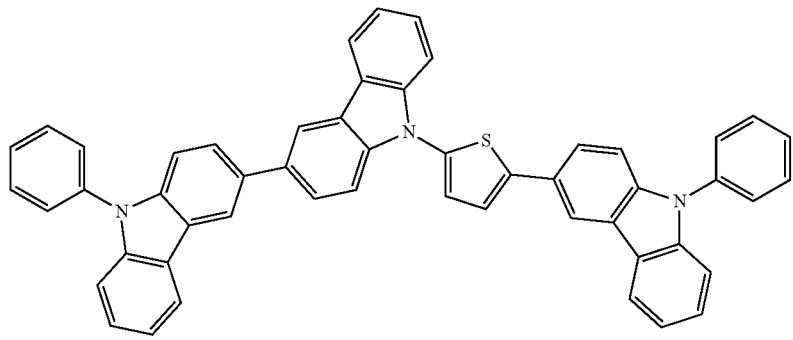
Compound HTL1-10
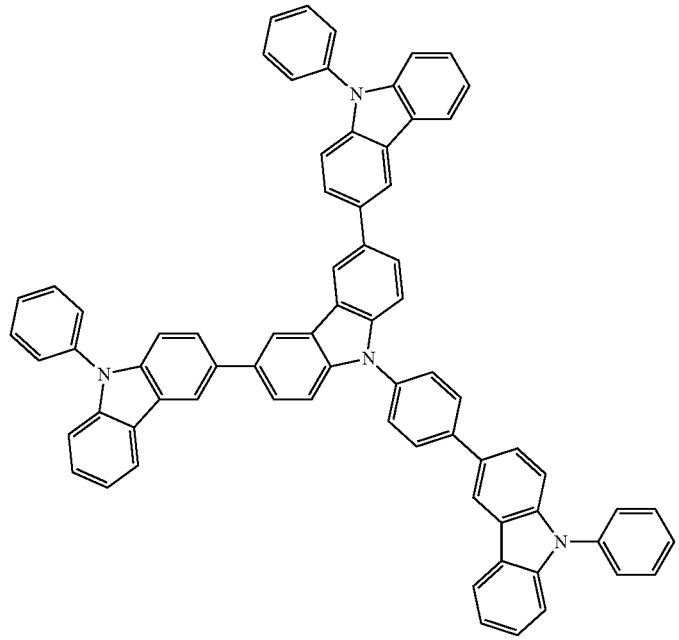
Compound HTL1-11
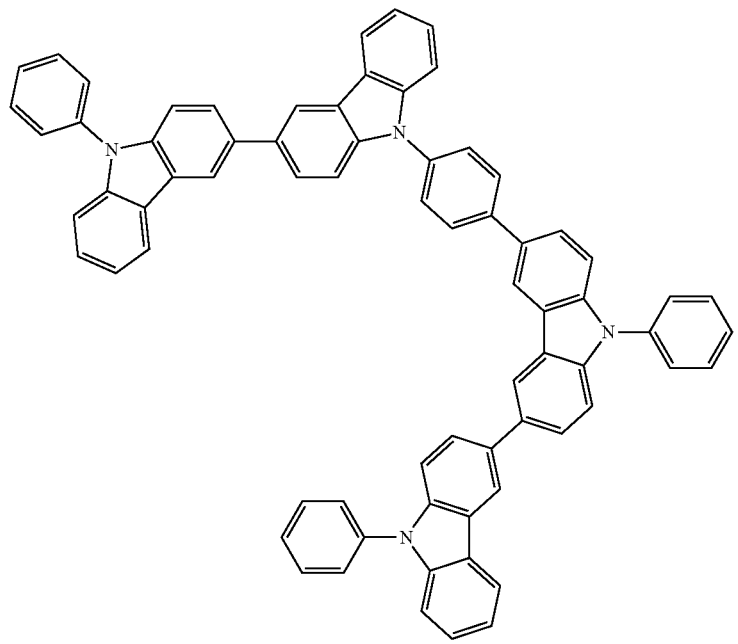
Compound HTL1-12

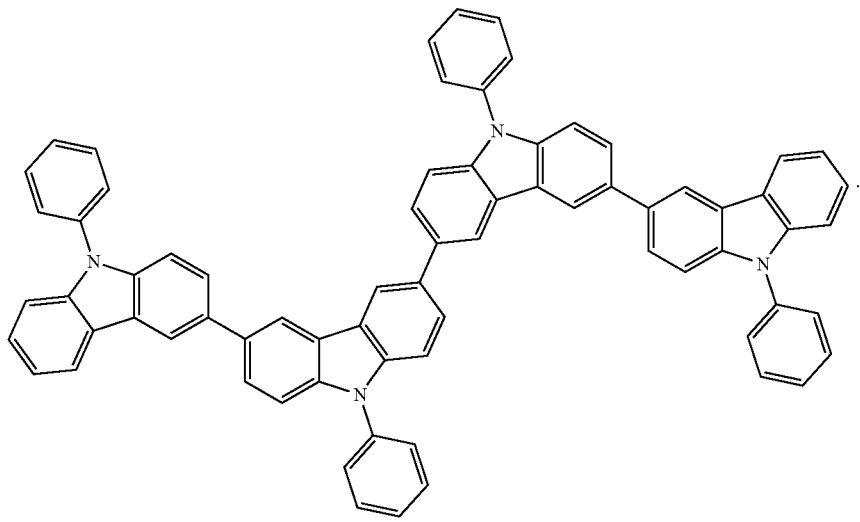

Compound HTL1-13

8. The organic light emitting device according to claim 1, wherein the host material is a compound comprising a triphenylene containing benzo-fused thiophene or benzo-fused furan, wherein any substituent in the compound is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1-Ar_2$, $C_nH_{2n}-Ar_1$, or no substitution, wherein n is 1, 2, 3, 4, 5, 6, 7, 8, 9, or 10, and wherein $Ar_1$ and $Ar_2$ are independently selected from the group consisting of benzene, biphenyl, naphthalene, triphenylene, carbazole, and heteroaromatic analogs thereof.

9. The organic light emitting device according to claim 8, wherein the host material is represented by the structure of formula (H-IV):

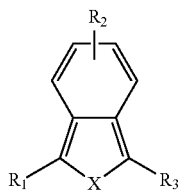

(H-IV)

wherein X is S or O;
wherein $R_1$, $R_2$, and $R_3$ are unfused substituents independently selected from the group consisting $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1-Ar_2$, $C_nH_{2n}-Ar_1$, or no substitution, and wherein each of $R_1$, $R_2$ and $R_3$ may represent mono, di, tri, or tetra substitutions;
wherein n is 1, 2, 3, 4, 5, 6, 7, 8, 9, or 10;
wherein $Ar_1$ and $Ar_2$ are independently selected from the group consisting of benzene, biphenyl, naphthalene, triphenylene, carbazole, and heteroaromatic analogs thereof; and
wherein at least one of $R_1$, $R_2$ and $R_3$ includes a triphenylene group.

10. The organic light emitting device according to claim 9, wherein X is S.

11. The organic light emitting device according to claim 9, wherein X is O.

12. The organic light emitting device according to claim 8, wherein the host material is represented by the structure of formula (H-V):

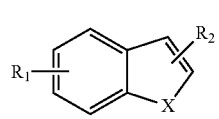

(H-V)

wherein X is S or O;
wherein $R_1$, $R_2$, and $R_3$ are unfused substituents independently selected from the group consisting $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1-Ar_2$, $C_nH_{2n}-Ar_1$, or no substitution, and wherein each of $R_1$, $R_2$ and $R_3$ may represent mono, di, tri, or tetra substitutions;
wherein n is 1, 2, 3, 4, 5, 6, 7, 8, 9, or 10;
wherein $Ar_1$ and $Ar_2$ are independently selected from the group consisting of benzene, biphenyl, naphthalene, triphenylene, carbazole, and heteroaromatic analogs thereof; and
wherein at least one of $R_1$, $R_2$ and $R_3$ includes a triphenylene group.

13. The organic light emitting device according to claim 12, wherein X is S.

14. The organic light emitting device according to claim 12, wherein X is O.

15. The organic light emitting device according to claim 8, wherein the host material is represented by the structure of formula (H-VI):

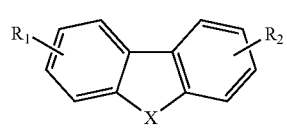

(H-VI)

wherein X is S or O;

wherein $R_1$, $R_2$, and $R_3$ are unfused substituents independently selected from the group consisting $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1-Ar_2$, $C_nH_{2n}-Ar_1$, or no substitution, and wherein each of $R_1$, $R_2$ and $R_3$ may represent mono, di, tri, or tetra substitutions;

wherein n is 1, 2, 3, 4, 5, 6, 7, 8, 9, or 10;

wherein $Ar_1$ and $Ar_2$ are independently selected from the group consisting of benzene, biphenyl, naphthalene, triphenylene, carbazole, and heteroaromatic analogs thereof; and wherein at least one of $R_1$, $R_2$ and $R_3$ includes a triphenylene group.

16. The organic light emitting device according to claim 15, wherein X is S.

17. The organic light emitting device according to claim 15, wherein X is O.

18. The organic light emitting device according to claim 1, wherein the first hole transport material has a HOMO energy level that is between that of the second hole transport material and the host material.

19. The organic light emitting device according to claim 1, wherein the first hole transport material has a LUMO energy level that is higher than that of the second hole transport material.

* * * * *

UNITED STATES PATENT AND TRADEMARK OFFICE
CERTIFICATE OF CORRECTION

PATENT NO. : 9,705,092 B2
APPLICATION NO. : 14/237142
DATED : July 11, 2017
INVENTOR(S) : Hitoshi Yamamoto et al.

It is certified that error appears in the above-identified patent and that said Letters Patent is hereby corrected as shown below:

In the Specification

Column 19, Lines 1-30, please delete:

"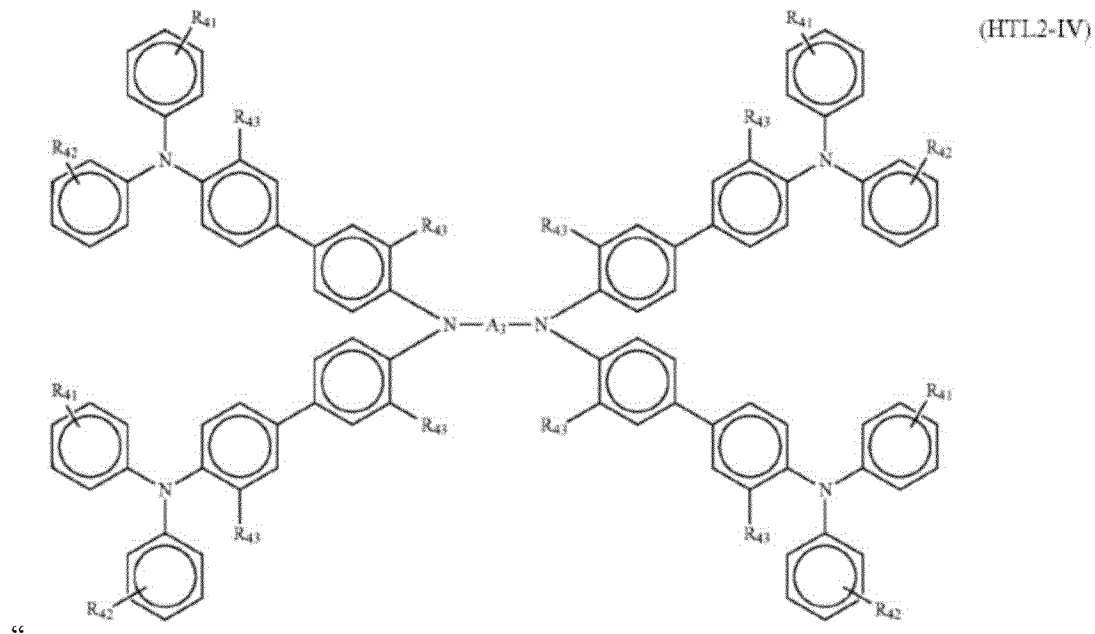"

Signed and Sealed this
Twenty-fifth Day of September, 2018

Andrei Iancu
*Director of the United States Patent and Trademark Office*

CERTIFICATE OF CORRECTION (continued)
U.S. Pat. No. 9,705,092 B2

And insert:

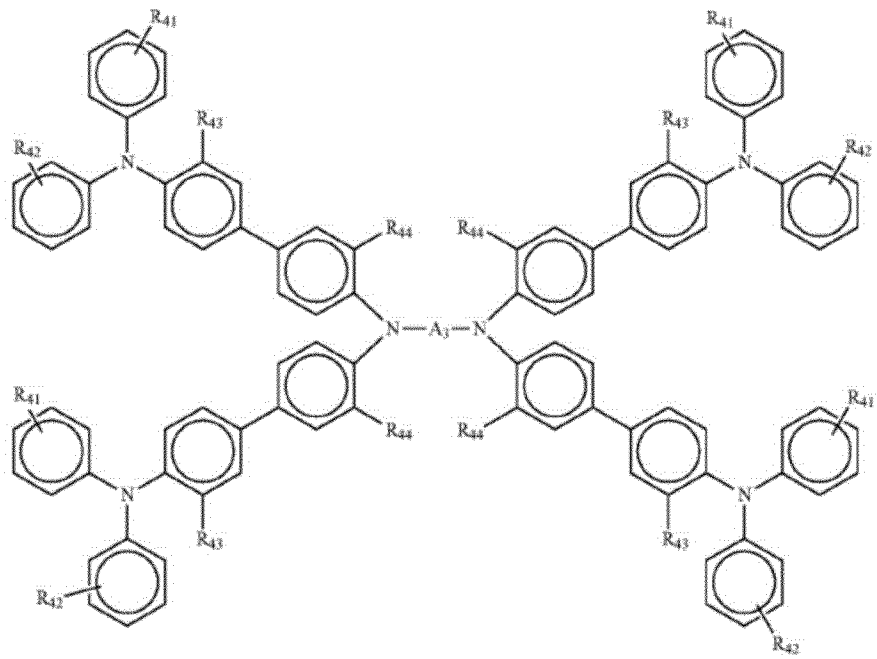

-- --